US010217611B2

(12) United States Patent
Aramaki et al.

(10) Patent No.: US 10,217,611 B2
(45) Date of Patent: Feb. 26, 2019

(54) PLASMA PROCESSING APPARATUS AND PLASMA PROCESSING METHOD

(71) Applicant: Hitachi High-Technologies Corporation, Tokyo (JP)

(72) Inventors: Tooru Aramaki, Tokyo (JP); Kenetsu Yokogawa, Tokyo (JP); Masaru Izawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/057,157

(22) Filed: Mar. 1, 2016

(65) Prior Publication Data

US 2016/0351404 A1    Dec. 1, 2016

(30) Foreign Application Priority Data

May 28, 2015    (JP) ................. 2015-108070

(51) Int. Cl.
*C23C 16/00*    (2006.01)
*C23F 1/00*    (2006.01)
(Continued)

(52) U.S. Cl.
CPC .. *H01J 37/32183* (2013.01); *H01J 37/32192* (2013.01); *H01J 37/32577* (2013.01); *H01J 37/32715* (2013.01); *H01L 21/31116* (2013.01)

(58) Field of Classification Search
USPC ....... 118/728–730, 723 MW, 723 E, 723 ER, 118/723 I, 723 IR; 156/345.51–345.55,
(Continued)

(56) References Cited

U.S. PATENT DOCUMENTS

| 2001/0022293 A1* | 9/2001 | Maeda | H01J 37/32082 216/67 |
| 2002/0007915 A1* | 1/2002 | Hirose | H01J 37/32082 156/345.12 |

(Continued)

FOREIGN PATENT DOCUMENTS

| CN | 104217914 | * 12/2014 |
| JP | 2007-258417 A | 10/2007 |

(Continued)

OTHER PUBLICATIONS

Machine Translation CN104217914, Liang et al dt Dec. 17, 2014.*

*Primary Examiner* — Rakesh K Dhingra
(74) *Attorney, Agent, or Firm* — Mattingly & Malur, PC

(57) ABSTRACT

A plasma processing apparatus or a plasma processing method that processes a wafer to be processed, which is placed on a surface of a sample stage arranged in a processing chamber inside a vacuum container, using a plasma formed in the processing chamber, the apparatus or method including processing the wafer by adjusting a first high-frequency power to be supplied to a first electrode arranged inside the sample stage and a second high-frequency power to be supplied, via a resonant circuit, to a second electrode which is arranged in an inner side of a ring-shaped member made of a dielectric arranged on an outer peripheral side of a surface of the sample stage on which the wafer is placed, during the processing.

2 Claims, 15 Drawing Sheets

(51) Int. Cl.
*H01L 21/306* (2006.01)
*H01J 37/32* (2006.01)
*H01L 21/311* (2006.01)

(58) Field of Classification Search
USPC .............. 156/915, 345.41–345.49; 361/234
See application file for complete search history.

(56) References Cited

U.S. PATENT DOCUMENTS

| | | | |
|---|---|---|---|
| 2003/0037881 A1* | 2/2003 | Barnes | H01J 37/3244 156/345.44 |
| 2008/0236493 A1* | 10/2008 | Sakao | H01J 37/32091 118/723 I |
| 2009/0071938 A1* | 3/2009 | Dhindsa | H01J 37/32091 216/67 |
| 2010/0326957 A1* | 12/2010 | Maeda | H01J 37/20 216/67 |

FOREIGN PATENT DOCUMENTS

| | | |
|---|---|---|
| JP | 2011-009351 A | 1/2011 |
| JP | 2012-227278 A | 11/2012 |

* cited by examiner

PLASMA PROCESSING APPARATUS AND PLASMA PROCESSING METHOD

BACKGROUND OF THE INVENTION

1. Field of the Invention

The present invention relates to a plasma processing apparatus or a plasma processing method that processes a substrate-like sample such as a semiconductor wafer, which is placed and held on a sample stage arranged in a processing chamber inside a vacuum container, using a plasma of the processing chamber, and particularly to a plasma processing apparatus or a plasma processing method, that supplies high-frequency power to a sample stage during processing to form a bias potential above an upper surface of the sample, and processes the sample.

2. Description of the Related Art

In general, a technique of etching a film layer, which includes a mask formed in advance on an upper surface of a sample such as a semiconductor wafer, of a processing target having a film structure with plurality of the film layers using a plasma has been performed in a process of manufacturing a semiconductor device as a technique of forming a circuit of the device or a structure of a wiring. Recently, there has been a demand not only for further enhancement of accuracy in such processing using the plasma, but also for reduction of a region, which is a part on an outer peripheral side of the wafer and in which a variation in the processing is out of a tolerance range, so as to reduce the variation with respect to a center side of the processed result according to the processing of even a part on the further outer peripheral side of the wafer, to further increase the number of the devices that can be manufactured for each single wafer, and to enable enhancement of efficiency of the processing along with enhancement of a degree of integration of the semiconductor device.

In general, such a plasma processing apparatus is provided with a vacuum container, a processing chamber, which is arranged in the vacuum container and in which a sample is arranged and a plasma is formed in depressurized interior space, and a vacuum evacuation device which evacuates an inside of the processing chamber to be at pressure with a predetermined degree of vacuum suitable for processing. Further, the plasma processing apparatus is provided with a gas supply device, which is connected to the vacuum container or the vacuum processing chamber and supplies gas for processing the sample in the processing chamber, a sample stage having an upper surface on which the wafer as a material to be processed is placed and held, a plasma generation device which supplies an electric field or a magnetic field for generation of the plasma in the processing chamber into the processing chamber, and the like.

A technique that causes intensity of an electric field, formed above an upper surface of a wafer from a part on a center side to a part on an outer periphery side of the wafer, or distribution thereof to be more uniformly approximated has been considered in order to reduce a region in which a characteristic of processing such as processing speed and a shape after the processing as a result thereof are varied between the center-side part to the part on the outer peripheral side of the wafer, for example, speed (rate) of an etching process is changed. That is, the above-described change in the etching rate in the part on the outer peripheral side of the wafer appears such that the rate increases when the concentration of the electric field is generated in the region on the outer peripheral side of the wafer, and the distribution of a potential or a charged particle of the plasma is lopsided, and thus, it is possible to implement the more uniform processing even to the part on the outer peripheral side of the wafer by suppressing such concentration of the electric field. In order to this, it is effective to adjust the intensity of the electric field, to be formed in a region surrounding the perimeter of the part on the outer peripheral side of the wafer and the distribution thereof, and to set a thickness of a sheath to be formed above the upper surface of the wafer to be more uniformly approximated even to the part on the outer peripheral side in an in-plane direction of the wafer, and particularly, in a radial direction.

A technique, as disclosed in JP-2007-258417-A (Patent Literature 1), of performing control of an electric field between an outer peripheral edge and a region in a vicinity thereof of a wafer during being etched by applying a DC voltage to a focus ring which is a member having conductivity and is arranged to surround the wafer on the outer peripheral side thereof, has been known as a conventional technique of such a plasma processing apparatus. In this conventional technique, a DC voltage value is changed so as to maintain an initial performance depending on the amount of wear of the focus ring caused when the focus ring, which has an upper surface facing a plasma, is abraded due to an interaction with the plasma.

In addition, a configuration, which is provided with a conductor ring arranged on an outer peripheral side on a wafer placement surface of a sample stage to surround a wafer and a dielectric ring cover covering an upper surface of the ring from above the ring, and supplies high-frequency power to the conductor ring while preventing electrical combination with a plasma formed above the ring cover inside a processing chamber, has been disclosed as illustrated in JP-2012-227278-A (Patent Literature 2). Further, this conventional technique also includes a configuration of reducing a variation in height of a bias equipotential surface to be formed above the wafer and the conductor ring, and in angle at which a charged particle of the plasma is incident onto the wafer in a range from a center side to the outer peripheral side of the wafer by setting a height of the conductor ring to be higher than a height of the wafer or an upper surface of the same stage on which the wafer is placed, and accordingly, reducing the variation in the processed shape as a result of the processing.

In addition, JP-2011-9351-A (Patent Literature 3) discloses a technique of adjusting the amount of high-frequency electric power for formation of a bias potential to be applied to a conductive focus ring, which is arranged to surround a wafer on an outer peripheral side of a sample stage, according to a wear amount of the focus ring.

SUMMARY OF THE INVENTION

However, the above-described conventional techniques still have the problems as the consideration for the following points is insufficient.

That is, the inventors has found out that all the above-described techniques can be employed only for a limited application and have a limit in improvement of performance although showing a certain degree of effects for improvement of the uniformity on the outer peripheral portion of the wafer as a result of study.

In JP-2007-258417-A, an upper surface of the conductor ring, which is arranged on the outer peripheral side of a surface of the sample stage with the wafer being placed thereon and to which a DC power is applied, is exposed to a space inside the processing chamber on an upper side so as to allow the plasma formed above the upper surface and the DC power to be combined. In such a configuration, wear such as abrasion of the conductor ring progresses or the material is altered due to interaction with the plasma, for example, collision of charged particles inside the plasma with the upper surface of the conductor. In a case in which it is configured such that the upper surface of the conductor ring is coated with a member made of the dielectric or an insulator as described in JP-2012-227278-A in order to suppress the above-described problem, the DC power is hardly combined with the plasma, and accordingly, the adjustment of intensity of an electric field or distribution thereof in the part on the outer peripheral side of the wafer or on the upper side of the ring using the ring becomes difficult.

In addition, JP-2012-227278-A is provided with a configuration in which the conductor ring arranged on the outer peripheral side of the wafer placement surface of the sample stage is placed on a step (recessed portion) arranged on the outer peripheral side of the placement surface of a base material which is arranged inside the sample stage on a lower side of the placement surface and is an electrode made of metal, and accordingly, high-frequency power for formation of a bias potential to be supplied to the base material is distributed and supplied. However, because a configuration of suitably changing a voltage value to be formed on the upper side of the upper surface of the ring is not provided in the above-described configuration, even when the bias potential formed by the electrode on the lower side of the placement surface is too great, the bias potential, on the upper side of the conductor ring arranged on the outer peripheral side of the wafer, is hardly adjusted in a suitable range and increases more than necessary. Thus, there is a risk that a degree of concentration of the electric field increases in the part on the outer peripheral side of the wafer, the uniformity in characteristic of the processing is degraded, for example, an etching rate locally increases and lopsided, and accordingly, a yield of the processing drops.

In addition, JP-2011-9351-A describes a configuration in which a distributor is provided on a supply path of the high-frequency power for formation of the bias potential to be supplied to a base material as an electrode inside the sample stage, and the high-frequency power, which has been adjusted and divided into a predetermined proportion by the distributor, is supplied to the conductor ring which is arranged on the outer peripheral side of a wafer placement surface of the base material and is surrounded by a cover made of an insulator. However, it has found out that it is difficult to efficiently control the outer peripheral portion only with this configuration since the most of power of the high-frequency power is cut off by the insulator of the cover surrounding the conductor ring in this configuration.

In the above-described conventional techniques, there is no consideration on the problem that it is difficult to adjust and supply the high-frequency power to the conductor ring arranged on the outer peripheral side of the wafer so as to obtain a desired distribution of the electric field, and accordingly, the variation in characteristic of the processing in the part on the outer peripheral side of the wafer with respect to the center portion becomes great, thereby degrading the yield of the processing. An object of the present invention is to provide a plasma processing apparatus or the plasma processing method that enhances the yield.

The above-described object is achieved by a plasma processing apparatus that processes a wafer to be processed, which is placed on a surface of a sample stage arranged in a processing chamber inside a vacuum container, using a plasma formed in the processing chamber, the plasma processing apparatus including: a first electrode, which is arranged inside the sample stage and to which a first high-frequency power is supplied during the processing; a second electrode, which is arranged in an inner side of a ring-shaped member made of a dielectric arranged on an outer peripheral side of a surface of the sample stage on which the wafer is placed, and to which a second high-frequency power is supplied via a resonant circuit during the processing; and a control device which adjusts the supply of the first and second high-frequency powers.

In addition, the above-described object is achieved by a plasma processing method that processes a wafer to be processed, which is placed on a surface of a sample stage arranged in a processing chamber inside a vacuum container, using a plasma formed in the processing chamber, the plasma processing method including processing the wafer by adjusting a first high-frequency power to be supplied to a first electrode arranged inside the sample stage and a second high-frequency power to be supplied, via a resonant circuit, to a second electrode which is arranged in an inner side of a ring-shaped member made of a dielectric arranged on an outer peripheral side of a surface of the sample stage on which the wafer is placed, during the processing.

According to the present invention, it is possible to form a series resonant structure with an insulating susceptor which is a capacitive capacitor by providing a coil on a previous stage of a conductive ring to which a high frequency is applied, and accordingly impedance is dramatically reduced and the high frequency efficiently contributes on a wafer edge.

DESCRIPTION OF THE EMBODIMENTS

Hereinafter, an embodiment of the present invention will be described with reference to the drawings.

First Embodiment

Figure 1:
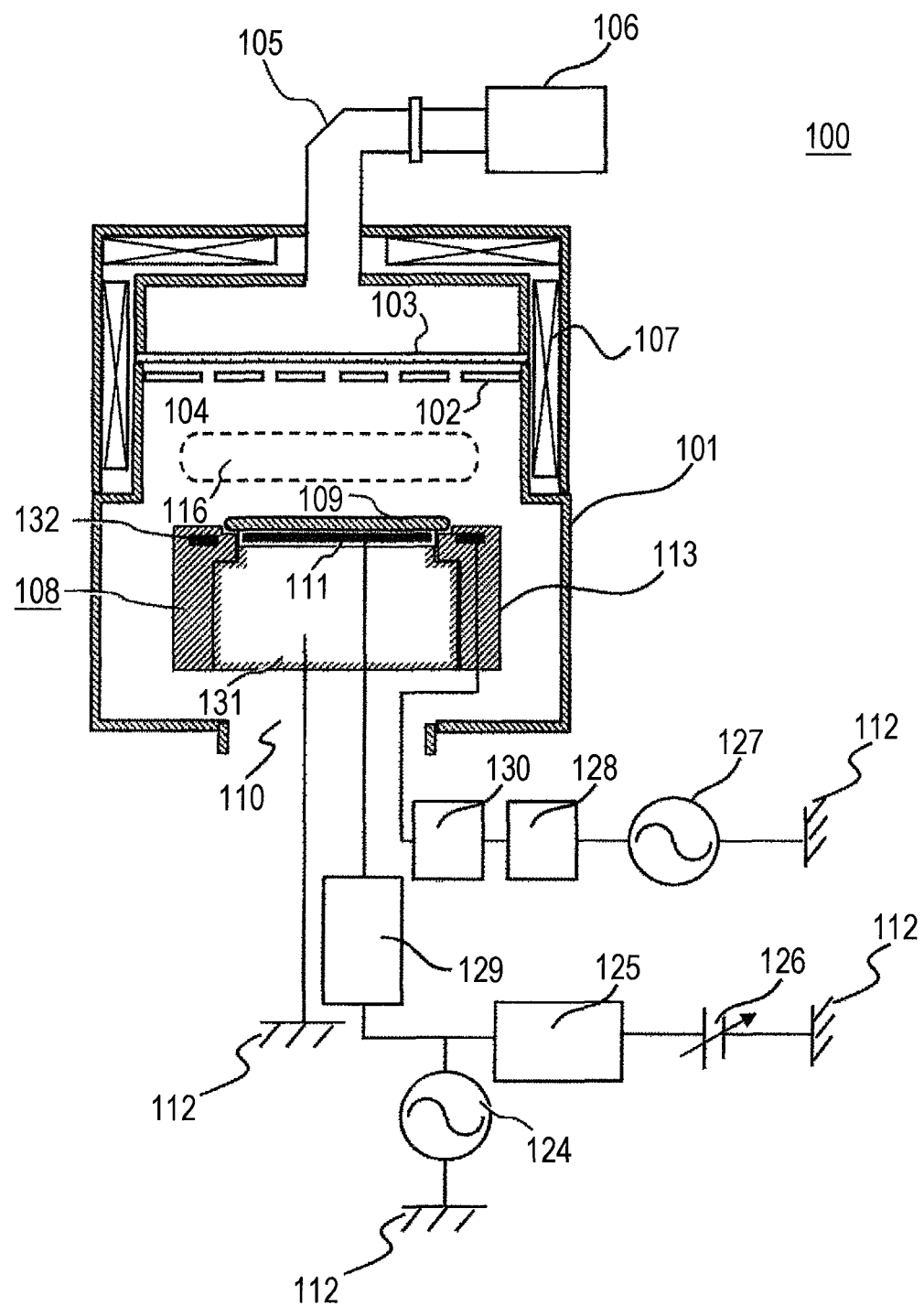
FIG. 1 is a vertical cross-sectional view schematically illustrating an outline of a configuration of a plasma processing apparatus according to an embodiment of the present invention.

Hereinafter, an embodiment of the present invention will be described with reference to FIGS. 1 to 4. FIG. 1 is a vertical cross-sectional view schematically illustrating an outline of a configuration of a plasma processing apparatus according to an embodiment of the present invention. This example illustrates a microwave electron cyclotron resonance (ECR) plasma etching apparatus which etches a film as a processing target on an upper surface of a semiconductor wafer by forming a plasma to excite atoms or molecules of gas supplied in a processing chamber using a specific frequency of a microwave band as an electric field for formation of a plasma in the processing chamber, and further supplying a magnetic field with intensity corresponding to the frequency of the electric field in the processing chamber so as to allow ECR to be generated by an interaction between the electric field and the magnetic field.

A plasma processing apparatus according to the present embodiment is provided with a vacuum container 101 in which a processing chamber 104 having a cylindrical shape is arranged, a plasma formation unit which is arranged on an upper side and an outer periphery of the vacuum container 101 and supplies an electric field and a magnetic field for formation of a plasma into the processing chamber 104 in the vacuum container 101, and a vacuum evacuation unit having a roughing vacuum pump such as a turbo-molecular pump and a rotary pump which is connected to a lower side of the vacuum container 101 and evacuates an inside of the processing chamber 104. A dielectric window 103, which has a disc shape and is made of, for example, quartz, is arranged in an upper part of the processing chamber 104 to hermetically partition an inside and an outside of the processing chamber 104, and covers an upper side of the processing chamber 104, thereby forming a ceiling surface thereof.

A shower plate 102, made of a dielectric (for example, quartz), on which a plurality of through-holes are arranged to introduce an etching gas is arranged in the processing chamber 104 on a lower side of the dielectric window 103. An approximately cylindrical space with a short height in which the supplied etching gas is diffused and filled is arranged between the shower plate 102 and the dielectric window 103, and the space is connected to a gas supply device 117 that supplies the etching gas via a gas introduction tube path. In addition, a vacuum evacuation port 110 communicating with a lower part of the processing chamber 104 is arranged on the lower side of the vacuum container 101, and a vacuum evacuation device which is the vacuum evacuation unit including the turbo-molecular pump (not illustrated) is connected to a lower side of the vacuum evacuation port 110.

A waveguide tube 105 to propagate the electric field to be introduced into the processing chamber 104 is arranged, as a plasma formation unit, on an upper side of the dielectric window 103. The waveguide tube 105 according to the present embodiment is roughly divided into two parts, and has a cylindrical tube portion which has an axis extending in a vertically upward direction and has a circular cross-section on an upper side of the processing chamber 104, and a prismatic tube portion which is connected to an upper end portion of the cylindrical tube portion, has an axis being oriented from the cylindrical portion and bent to extend in a horizontal direction and has a rectangular cross-section. An electric field generating power source 106 such as a magnetron which oscillates and forms an electric field of microwave is arranged in an end portion of the prismatic tube portion, and the electric field oscillated and formed in the electric field generating power source 106 is propagated through the waveguide tube 105, enters a cylindrical space for oscillation which is connected to a lower side of a lower end portion of the cylindrical tube portion, and is set to a predetermined mode of the electric field, and then, transmits through the dielectric window 103 and is supplied into the processing chamber 104.

Although a frequency of an electromagnetic wave is not particularly limited, a microwave of 2.45 GHz is used in the present embodiment. Further, a magnetic field generating coil 107, which is a solenoidal coil for formation of the magnetic field to be supplied into the processing chamber 104, is arranged to surround an upper side and sides of the processing chamber 104 on an outer peripheral side of the processing chamber 104 of the vacuum container 101. The electric field which has been propagated and introduced inside the processing chamber 104 interacts with the magnetic field that has been formed in the magnetic field generating coil 107 and introduced inside the processing chamber 104 to excite particles of the etching gas, which has been supplied similarly into the processing chamber 104, and accordingly, the plasma is generated in the processing chamber 104.

In addition, a sample stage 108 is arranged in a lower part inside the processing chamber 104. An upper surface of the sample stage 108 is coated with a dielectric film which is a film made of a material including a dielectric formed by thermal spraying, and a wafer 109, which is a substrate-like sample as a processing target, is placed and held on an upper surface of the dielectric film. The placement surface to which the wafer 109 is placed opposes the dielectric window 103 or the shower plate 102.

A conductor film 111 made of a conductor material is arranged inside the dielectric film, is connected with a DC power source 126 via a high-frequency filter 125, and is configured as a film-like electrode. Further, the sample stage 108 has an approximately cylindrical shape to be arranged in accordance with an axis of the processing chamber 104, and a base material 131, which has a disc shape and made of metal, is arranged therein as an electrode to which a first high-frequency power source 124 is electrically connected via a matching device 129.

A susceptor 113, which is a ring-shaped member made of a dielectric such as quartz, is arranged on an outer peripheral side of a film (dielectric film) which is made of a dielectric, is arranged on an upper surface of the base material 131, and has a substantially circular shape in accordance with a shape of the wafer 109. Thus, a height of the base material 131 is recessed to be low at a place on the outer peripheral side of the dielectric film, which is the placement surface of the sample stage 108, and is configured to be stepped from the upper surface of the dielectric film such that the susceptor 113 is placed in the ring-shaped recessed portion configuring the step, and a upper surface and a side surface of the sample stage 108 are covered and protected from the plasma.

In such a plasma processing apparatus 100, a vacuum container for transport (not illustrated) is connected to a side surface of the vacuum container 101 via a gate, and the unprocessed wafer 109, which is placed and held on an arm of a transport robot arranged inside the vacuum container for transport (a vacuum transport container), passes through the gate and carried in the processing chamber 104. The wafer 109 transported inside the processing chamber 104 is handed over from the arm to the sample stage 108, and is placed on the dielectric film configuring the upper surface of the sample stage 108. Thereafter, the wafer 109 is adsorbed and held on the dielectric film by an electrostatic force which is formed between the wafer 109 and the conductor film 111 when the DC voltage is supplied to the conductor film 111 from the DC power source 126.

Incidentally, the processing chamber 104 is hermetically blocked with respect to the vacuum transport container by a gate valve, which opens and closes the gate (not illustrated) at the time of processing, and an inside thereof is sealed. Thereafter, the vacuum evacuation device 108 is driven when the etching gas is introduced into the processing chamber 104 from the shower plate 102, and the interior pressure of the processing chamber 104 is maintained at a predetermined pressure according to a balance between a supply rate and an evacuation rate of the gas. In this state, a plasma 116 is formed in the processing chamber 104 by an interaction between the electric field and the magnetic field supplied from the plasma formation unit.

When the plasma 116 is formed in the processing chamber 104 on the upper side of the sample stage 108, the high-frequency power is supplied to the base material 131 from the high-frequency power source 124 connected to the base material 131 in the sample stage 108, and a bias potential is formed on the dielectric film and the wafer 109 on the upper surface of the sample stage 108. When the charged particle such as ions in the plasma 116 are attracted toward the upper surface of the wafer 109 due to a potential difference between the bias potential and the plasma 116 and collide with a top surface having a film structure which has been formed in advance on the upper surface of the wafer 109, the film layer as the processing target having the film structure, arranged on the upper surface of the wafer 109 and configured to form a circuit of a semiconductor device, is etched.

Incidentally, gas for promotion of heat transfer such as helium is introduced into a portion between a rear surface of the wafer 109 and the upper surface of the dielectric film of the sample stage 108 while the etching process is performed, although not illustrated, and promotes heat exchange with a coolant flow path which is arranged inside the base material 131 of the sample stage 108 and in which a coolant for cooling flows, and accordingly, the temperature of the wafer 109 is adjusted to a value in a range suitable for the processing. In addition, the etching gas and a reaction product generated by the etching are evacuated from the vacuum evacuation port 110 which is arranged on a bottom portion of the vacuum container 101 and communicates with the lower part of the processing chamber 104 and a vacuum pump inlet of the vacuum evacuation device.

When a predetermined etching process on the film structure of the upper surface of the wafer 109 ends, the supply of the high-frequency power from the high-frequency power source 124 is stopped, the supply of power for the adsorption from the DC power source 126 is stopped, and the static electricity is removed. Then, the wafer 109 is raised to the upper side of the sample stage 108, and handed over to the arm of the transport robot, which has passed through the gate opened by the gate valve and entered the processing chamber 104, and then, the unprocessed wafer 109 is carried to the upper side of the sample stage 108 again. Thereafter, the unprocessed wafer 109 is placed on the upper side of the sample stage 108 and the processing of the wafer 109 is initiated. In the case of absence of the unprocessed wafer 109 that needs to be processed, an operation of the plasma processing apparatus 100 for the wafer processing ends, and deactivation or an operation for maintenance is performed.

In addition, it may be configured such that a heater (not illustrated) is arranged in an inner side of the base material 131 having a cylindrical shape of the sample stage 108 or the dielectric film having a disc or circular shape such that the wafer 109 placed on the sample stage 108 or the upper side of the upper surface of the dielectric film can be heated to the temperature suitable for the processing. In addition, a coolant flow path, which is concentrically or helically arranged around the center of the base material 131 and in which a heat transfer medium (coolant) with temperature being set to a value in a range of predetermined values by a temperature adjustment device (not illustrated), is arranged inside the base material 131 in order to reduce or suppress the increase in temperature of the wafer 109 to be heated by the heater or by being exposed to the plasma 116 during the processing.

A temperature sensor (not illustrated), configured to detect temperature of the base material 131 or the sample stage for the temperature adjustment, a plurality of pins to be lowered to allow the wafer 109 to be spaced apart to the upper side of the dielectric film or to place the wafer on the upper surface of the film, and a position sensor of the pin, a connector on a power supply path to the conductor film 111 and the base material 131, and the like are arranged inside the base material 131 of the sample stage 108, and there is a concern that those members malfunction under the environment with great electrical noise. In addition, there is a concern that the coolant also tinged with the static electricity under the environment with the electrical noise. In the present embodiment, the base material 131 is electrically connected to the ground 112 as illustrated in FIG. 1.

A conductor ring 132, which is arranged to surround the wafer 109 or the wafer placement surface of the dielectric film of the upper surface of the base material 131 and is made of metal, is arranged inside the susceptor 113 according to the present embodiment, and is electrically connected with a high-frequency power source 127 via a matching device 128 and a load impedance variable box 130. The high-frequency power having a predetermined frequency generated from the high-frequency power source 127 is introduced to the conductor ring 132 to form the potential above the upper surface thereof between the plasma 116 and the upper surface.

Incidentally, a supply path between the high-frequency power source 127 and the conductor ring 132 is arranged at a different location from a supply path between the high-frequency power source 124 and the conductor film 111 in the dielectric film in the example of FIG. 1. Instead of such a configuration, a configuration may be provided, as illustrated in FIG. 2, in which a supply path, which is branched between the matching device 129 and the conductor film 111 on the supply path electrically connecting the conductor film 111 and the high-frequency power source 124 via the matching device 129 and sets the conductor ring 132 to be electrically connected via the load impedance variable box 130, is arranged and the high-frequency power is introduced to the conductor ring 132.

Figure 2:
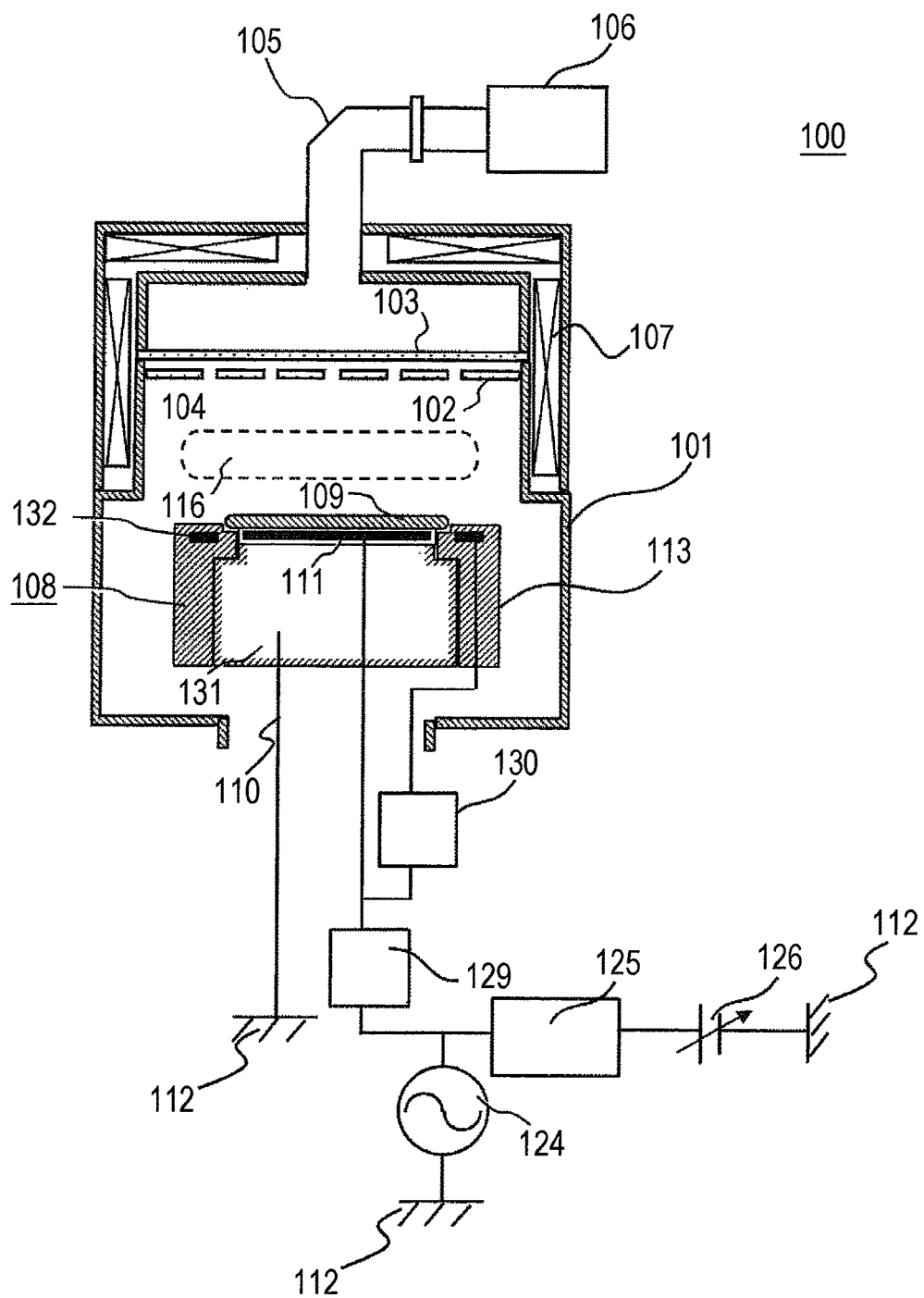
FIG. 2 is a vertical cross-sectional view schematically illustrating an outline of a configuration of a modified example of the plasma processing apparatus according to an embodiment illustrated in FIG. 1.

FIG. 2 is FIG. 2 is a vertical cross-sectional view schematically illustrating an outline of a configuration of a modified example of the plasma processing apparatus according to an embodiment illustrated in FIG. 1. The modified example of FIG. 2 has a difference in configuration from the embodiment of FIG. 1 in terms of the configuration of the power supply path of the high-frequency power regarding the conductor ring 132, but is the same as the embodiment of FIG. 1 regarding the other configurations, and thus, the description thereof, will be omitted.

In the examples illustrated in FIGS. 1 and 2, it is possible to apply a high frequency to a region on the outer peripheral side of the wafer 109 and draw the charged particles such as ions in the plasma 116 toward the outer peripheral side of the wafer 109 by decreasing a magnitude of the impedance from the high-frequency power source 127 to the outer peripheral portion of the wafer 109 through combination of the load impedance variable box 130 and a high impedance portion to be arranged in the upper part of the susceptor 113 made of the dielectric. Accordingly, the concentration of the electric field in the outer peripheral edge portion of the wafer 109 is suppressed. It is preferable that the frequency of the high-frequency power source 127 be the same as or a constant multiple of a frequency of the high-frequency power source 124.

Figure 3:
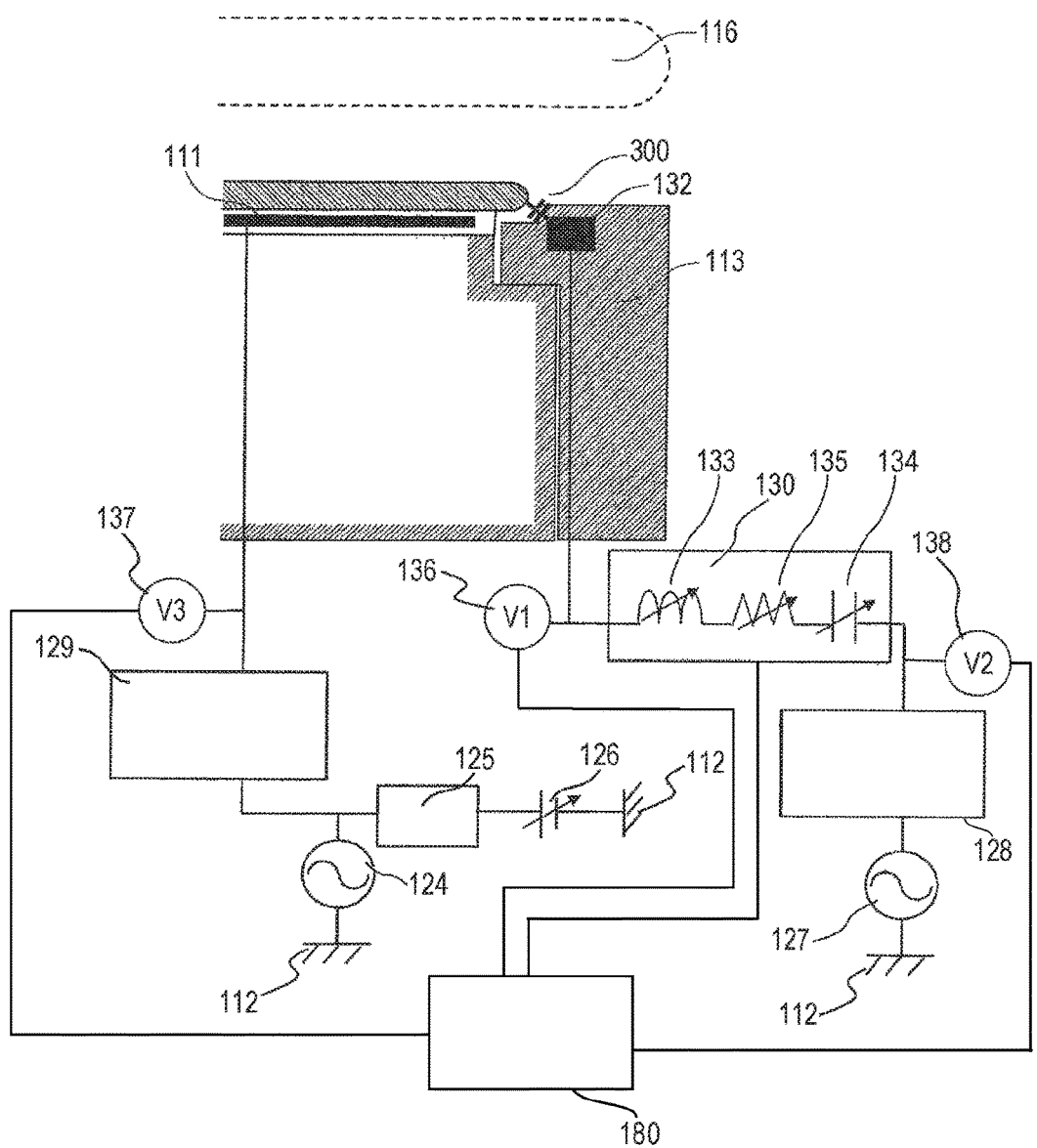
FIG. 3 is a vertical cross-sectional view schematically illustrating a configuration of a part on an outer peripheral side of a sample stage according to the embodiment illustrated in FIG. 1 in an enlarged manner.

A configuration of the load impedance variable box 130 will be described with reference to FIG. 3. FIG. 3 is a vertical cross-sectional view schematically illustrating a configuration of the part on the outer peripheral side of the sample stage according to the embodiment illustrated in FIG. 1 in an enlarged manner. FIG. 3 illustrates the configuration of the load impedance variable box 130 arranged on the power supply path which is connected to the conductor ring 132 arranged inside the susceptor 113.

A sheath portion having capacitance is present between the conductor ring 132 inside the susceptor 113 and the wafer 109 in a state in which the plasma 116 is formed. On consideration of a circuit of the high-frequency power including the conductor ring 132, the capacitance between the conductor ring 132 and the outer peripheral edge of the wafer 109 will be conveniently expressed by a capacitor 300.

In the present embodiment, the impedance on an equivalent circuit is reduced when a series resonance is generated on the equivalent circuit including the capacitor 300 which is a capacitance component by adjusting an inductance of a variable coil 133, arranged inside the load impedance variable box 130, to a suitable value. According to this configuration, it is possible to efficiency supply the high-frequency power from the high-frequency power source 127 to the wafer 109, and to form the bias potential.

In addition, a variable resistance 135 is further arranged between the variable coil 133 and the high-frequency power source 127 in the load impedance variable box 130, and it is possible to lower a Q value that mitigates a peak value of the series resonance by adjusting a resistance value of the variable resistance 135, and thus, it is possible to upgrade controllability. That is, it is possible to enhance control robustness as illustrated in FIG. 19.

Figure 15:
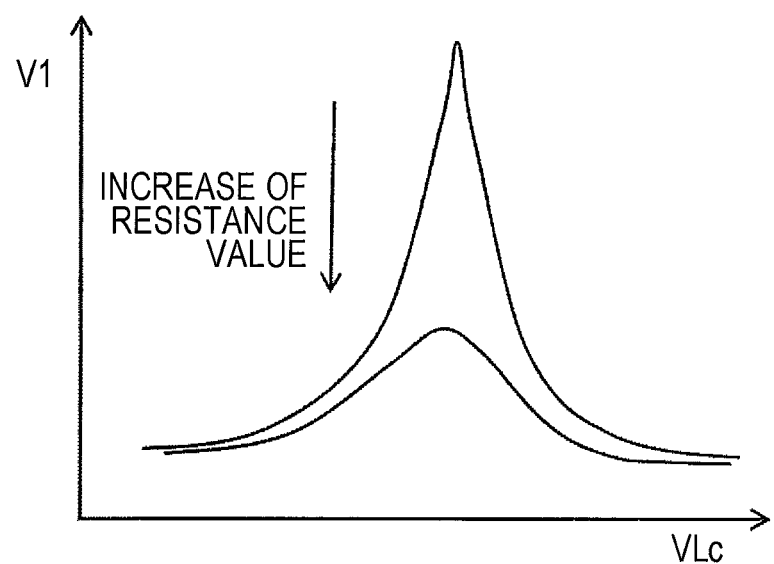
FIG. 15 is a graph schematically illustrating a result to be obtained by increasing or decreasing a resistance value of a variable resistance inside a load impedance variable box 130 illustrated in FIG. 3.

FIG. 15 is a graph schematically illustrating a result to be obtained by increasing or decreasing the resistance value of the variable resistance inside the load impedance variable box 130 illustrated in FIG. 3. In addition, the capacitance of the capacitor 300 is transitionally changed according to the wear of the susceptor caused by the plasma, and thus, a variable capacitor 134 of which capacitance can be varied may be arranged in the load impedance variable box 130 between the variable resistance 135 and the high-frequency power source 127 so as to correct such the change.

Further, it is possible to arrange a voltage monitor 136, which is a sensor to detect a voltage of a voltmeter or the like electrically connected to the power supply path, in the load impedance variable box 130, and to detect a variation of a load on the circuit of the high-frequency power passing through the plasma 116 from the high-frequency power source 127 using the detected voltage. Alternatively, it is possible to indirectly detect a change of the load from an initial stage at which the susceptor 113 is first used from a result of detecting a matching constant (for example, a capacitance value of the variable coil) inside the matching device 128 or a result of detecting the voltage value using the voltage monitor 138. Accordingly, it is possible to estimate the wear amount of the susceptor 113 from the initial stage.

In addition, the load impedance variable box 130 illustrated in FIG. 3 may be arranged on the supply path which is branched and connected to the conductor ring 132 as illustrated in FIG. 2. Since the impedance seen from the high-frequency power source 124 on the power supply path to supply the high-frequency power to the conductor film 111 is seen to be relatively low as compared to the case of FIG. 3 as the power supply path is connected to the conductor ring 132 in parallel in this case, there is a risk that a high-frequency voltage to be formed on the conductor film 111 drops and the processing speed (rate) of the wafer 109 drops.

Figure 4:
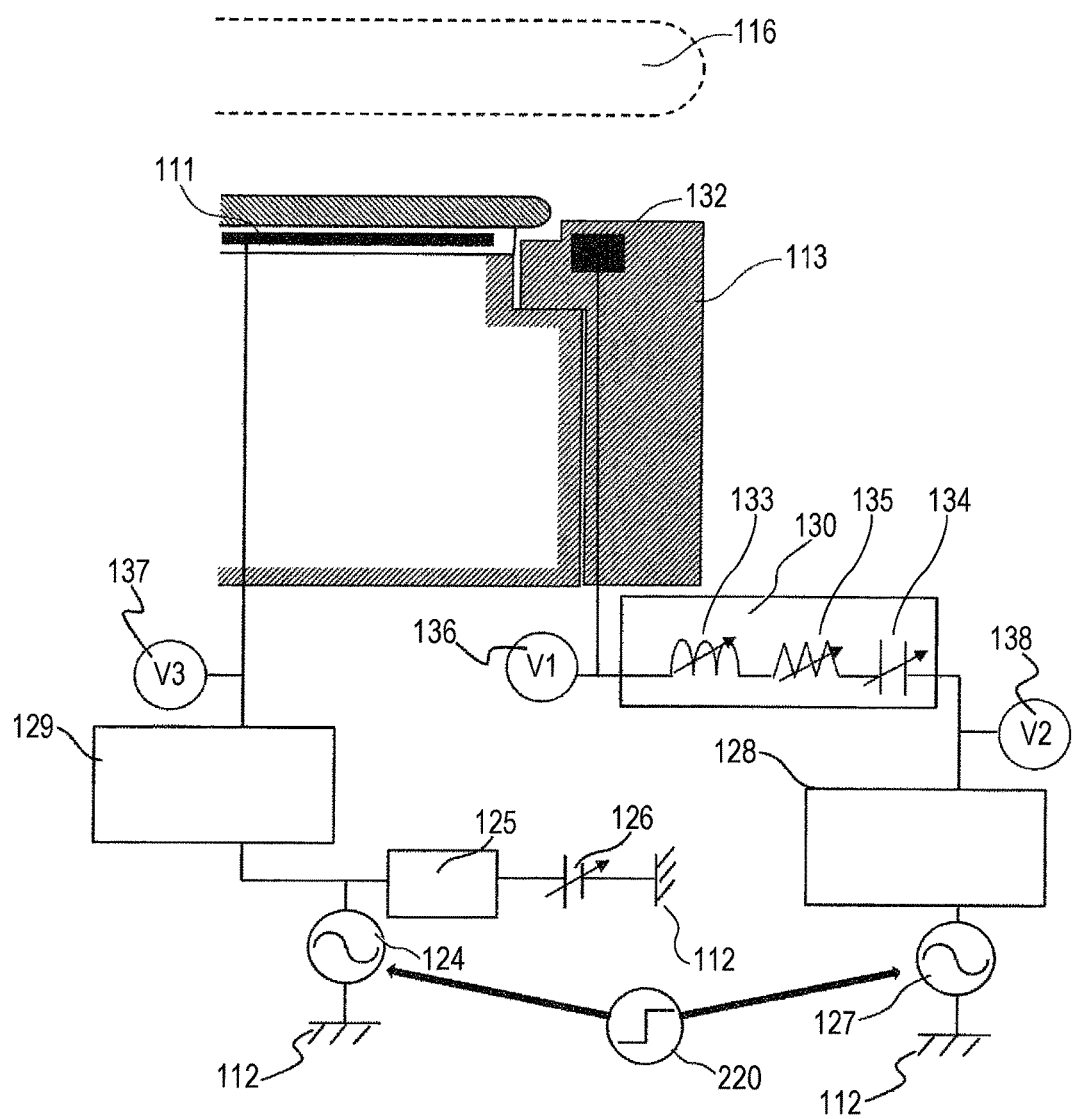
FIG. 4 is a vertical cross-sectional view schematically illustrating a modified example of the configuration of the part on the outer peripheral side of a sample stage according to the embodiment illustrated in FIG. 1 in an enlarged manner.

In order to prevent the risk, a voltage monitor 137 may be arranged inside the load matching device 129 so as to adjust the impedance or the matching constant of the load matching device 129 such that the detected voltage value becomes a target value with which an intended characteristic such as the processing rate can be realized. In addition, a clock generator 220 is electrically connected to the high-frequency power sources 124 and 127 as illustrated in FIG. 4 in order to generate a signal of power to be synchronously generated by the high-frequency power sources 124 and 127, and the signal such as a pulse or a square wave is periodically output from the clock generator 220 to these power sources such that a period of the power to be oscillated in the respective power sources is output while being synchronized between the power sources, thereby suppressing a beat signal generated by being interfered via the wafer 106.

Although the above-described embodiment illustrates the configuration in which the high-frequency power from the high-frequency power source 124 and the DC power from the DC power source 126 are supplied to the conductor film 111 in the dielectric film, a configuration may be provided in which power from each of the power sources is supplied to each of different conductor films arranged at different locations inside a dielectric film arranged on the upper surface of the base material 131. For example, a configuration may be provided in which a conductor film to which the DC power for electrostatic adsorption is supplied is arranged on an upper side in a dielectric film to be formed by thermal spraying of particles of a dielectric material, and a different conductor film to which the high-frequency power is supplied is arranged on a lower side in the dielectric film. Such a configuration may also be provided with the configuration in which the clock generator 220 illustrated in FIG. 4 is provided to transmit the signal for synchronization of output to the two high-frequency power sources 124 and 127.

Figure 5:
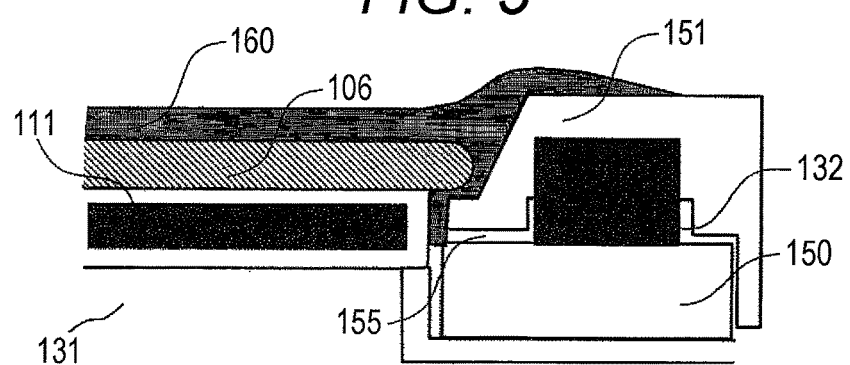
FIG. 5 is a vertical cross-sectional view schematically illustrating a configuration of an upper part of a susceptor according to the embodiment illustrated in FIG. 1 in an enlarged manner.
Figure 6A:
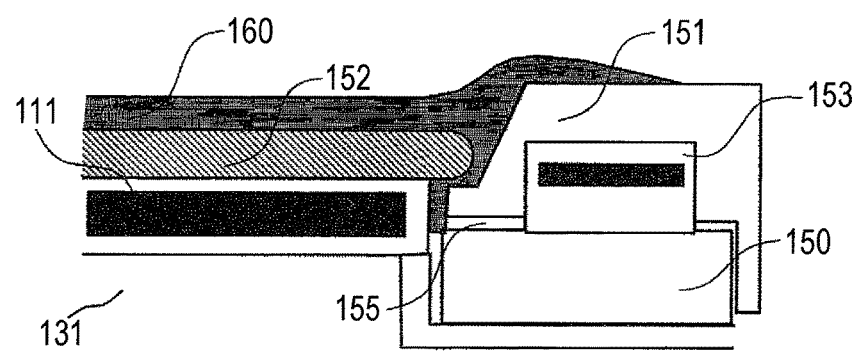
FIGS. 6A and 6B are vertical cross-sectional views schematically illustrating action of the embodiment illustrated in FIG. 5.
Figure 6B:
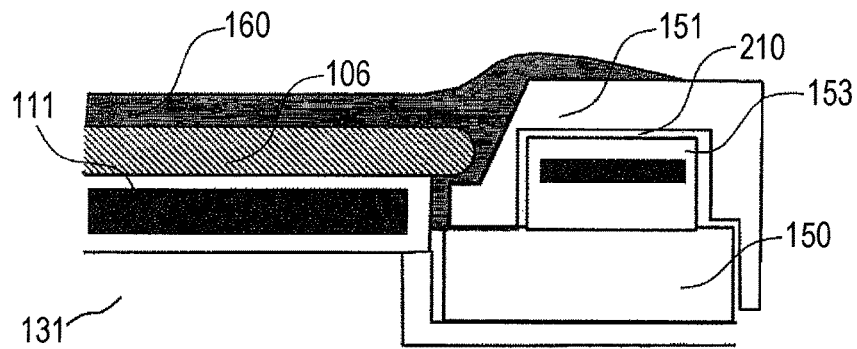
Figure 7A:
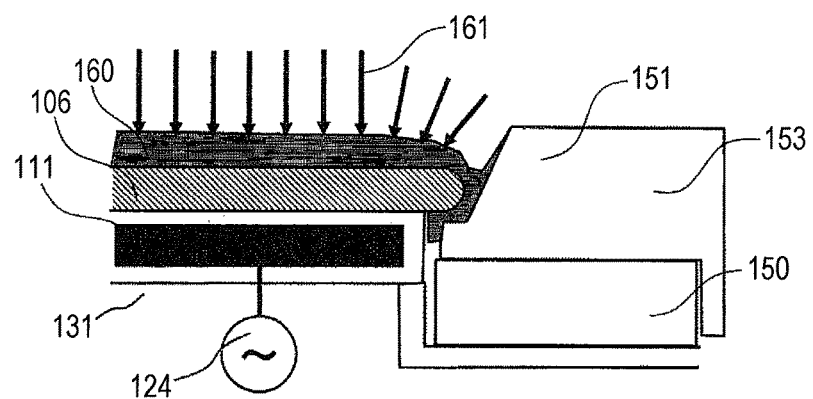
FIGS. 7A to 7C are vertical cross-sectional views schematically illustrating a configuration of a modified example of the upper part of the susceptor according to the embodiment illustrated in FIG. 5.
Figure 7B:
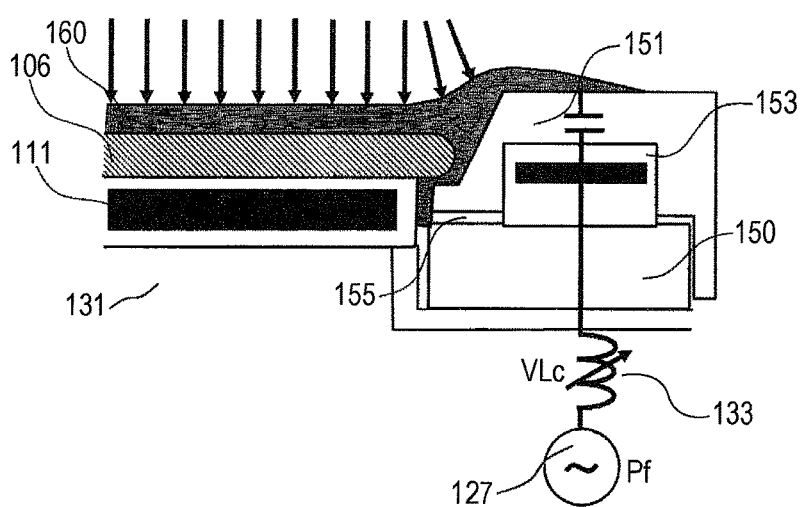
Figure 7C:
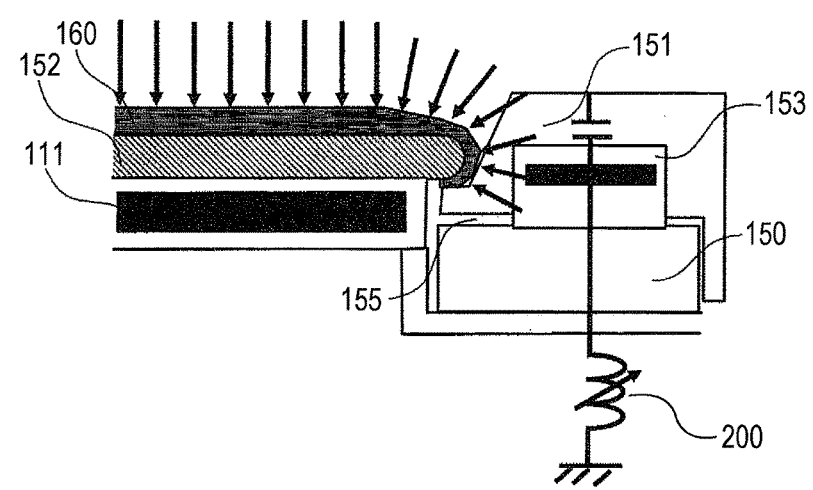

Next, the configuration of the susceptor 113 according to the above-described embodiment will be described with reference to FIGS. 5 to 7C. FIG. 5 is a vertical cross-sectional view schematically illustrating a configuration of the upper part of the susceptor according to the embodiment illustrated in FIG. 1 in an enlarged manner. FIGS. 6A and 6B are vertical cross-sectional views schematically illustrating action of the embodiment illustrated in FIG. 5. FIGS. 7A to 7C are vertical cross-sectional views schematically illustrating a configuration of the upper part of the susceptor according to a modified example of the embodiment illustrated in FIG. 5.

In FIG. 5, the susceptor 113 according to the present embodiment is configured of a plurality of members vertically arranged, an upper susceptor 151 to be arranged on an upper side is a ring-shaped member made of a dielectric, and is arranged on the upper side to cover a ring-shaped lower susceptor 150, placed and arranged on an upper side of the recessed portion arranged in the ring shape in the upper outer-periphery-side part of the base material 131, and the upper side of the conductor ring 132 placed on the upper surface of the lower susceptor 150. In the present embodiment, it is possible to generate an ion sheath 160 by allowing a high-frequency bias potential, generated by the high-frequency power to be supplied from the second high-frequency power source 127 to the conductor ring 132, to pass through the inside of the upper susceptor 151 and be efficiency formed above an upper surface of the upper susceptor 151 according to such a configuration.

According to the ion sheath 160, formation of a sheath having a peculiar shape due to the electric field the concentration generated at the outer peripheral edge of the wafer 106 occurring in the conventional technique is suppressed, and the equipotential surface to be formed inside the sheath 160 has a reduced portion which is not parallel to the upper surface of the wafer 106 in the part on the outer peripheral side of the wafer 106. In this manner, a range in which an angle at which the ion is incident to the wafer 106 becomes a desired angle, for example, a perpendicular angle is further extended to an outer peripheral end, and it is possible to reduce the variation in characteristic of the processing of the wafer 106, for example, the etching rate with respect to the in-plane direction of the wafer 106.

In addition, the upper susceptor 151 needs to have a sufficient thickness such that the high-frequency power is not applied to the lower susceptor 150 side. In the present embodiment, a thickness on the conductor ring of the upper susceptor 151 is set to be a value in a range of 1 to 3 mm, and a thickness of the lower susceptor 150 on the lower side of the conductor ring 132 is set to be a value in a range of 3 to 10 mm. Such a magnitude relation of thickness is desirably configured such that a distance between the conductor ring 132 and the plasma sheath 160, with the upper susceptor 151 interposed therebetween, is smaller than a distance between the conductor ring 132 and the base material 131 in the lower susceptor 150.

Figure 16A:
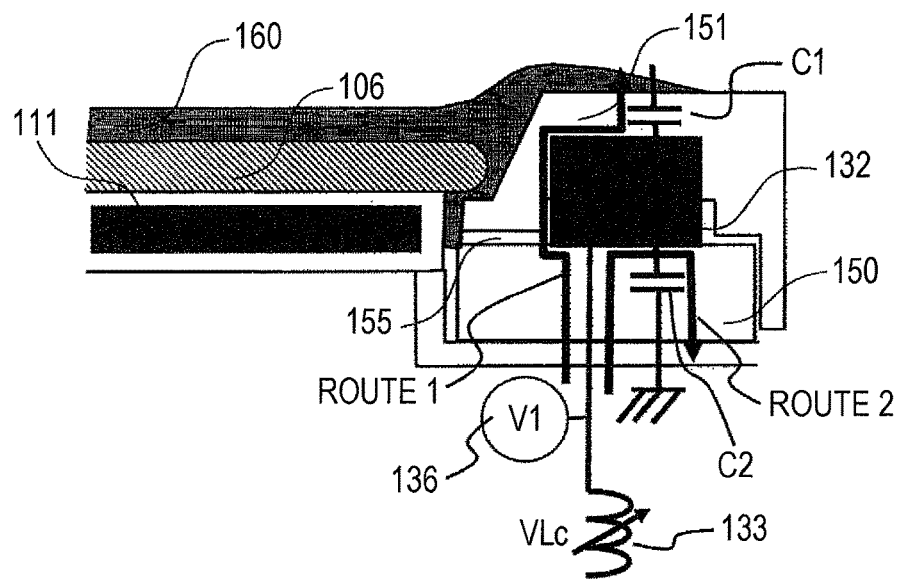
FIGS. 16A and 16B are vertical cross-sectional views schematically illustrating action to be exerted by the configuration of the embodiment illustrated in FIG. 5.
Figure 16B:
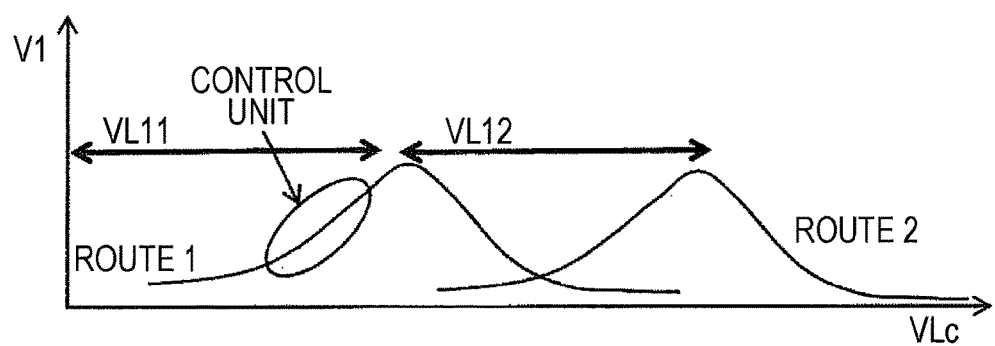

An operation principle of the configuration illustrated in FIG. 5 will be described with reference to FIGS. 16A and 16B. FIGS. 16A and 16B are vertical cross-sectional views schematically illustrating the action to be exerted by the configuration of the embodiment illustrated in FIG. 5.

FIG. 16A schematically illustrates a configuration of the upper part of the susceptor 113 according to the present embodiment in an enlarged manner as a longitudinal section. In the equivalent circuit according to the configuration of FIG. 16A, a path 1 and a path 2, indicated by arrows in FIG. 16A, are considered as the path in which the high-frequency power to be supplied from the second high-frequency power source 127 to the conductor ring 132 flows FIG. 16B schematically illustrates a relation between a voltage VLc of the variable coil 133 in the embodiment illustrated in FIG. 5 and a voltage value V1 to be detected by the output of the voltage monitor 136 using a graph. FIG. 16B illustrates the correlation regarding each of the path 1 and the path 2.

It is preferable that the power to be transferred to the path 2 be low in terms of enhancing the efficiency of the power to be supplied to cause the ion in the plasma to be attracted to the wafer 106. Thus, a difference VL12 between a value of VLc at a resonance point in the path 2 and a value at a resonance point in the path 1 is set to be larger than a value VL11 of VLc at a resonance point of the path 1 in the present embodiment.

Accordingly, it is possible to set a proportion of the power to be supplied to the path 2 to be small with a degree that can be substantially ignored in controlling the path 1. In the present embodiment, each material forming an electrostatic capacitance C1 and an electrostatic capacitance C2 and a dimension such as a thickness or a width of each shape thereof are selected to set the electrostatic capacitance C2 provided in the lower susceptor 150 in the path 2 to be sufficiently low while setting the electrostatic capacitance C1 provided in the upper susceptor 151 in the path 1 on the equivalent circuit to be sufficiently high in order to realize the above-described condition of VL12>VL11. In this state, VLc is adjusted depending on the value of C1 detected by a control device 180 to be described later to be a value in a predetermined tolerance range with which an intended thickness and a region of the sheath 160 can be obtained in a region in which V1 of the path 1 of FIG. 16B is monotonically increased with respect to a change in VLc.

Further, a configuration is provided in which a clearance 155 is arranged between the lower susceptor 150 and the upper susceptor 151, and the transfer of energy is performed between the sheath 160 and the conductor ring 132 made of metal. However, there is a risk that the charged particles in the plasma 116 formed in the processing chamber 104 or particles with increased reactivity such as active species enter the clearance 155, and interact with a wall surface of the member configuring the clearance 115 when an end portion of the clearance 155 faces and communicates with the processing chamber 104.

With respect to such a problem, a conductor film 153' made of metal may be arranged inside the insulator ring 153 configured using ceramics such as quartz, alumina, and yttria, instead of the conductor ring 132 made of metal illustrated in FIG. 5, as in the modified example illustrated in FIG. 6A. According to this configuration, the contact between the conductor ring 132 made of metal and the plasma 116 is reduced, and the contamination of the wafer 106 due to the product generated by the interaction therebetween is suppressed. Since it is possible to efficiently perform the energy transfer to the upper susceptor 151 side by setting the impedance to the lower susceptor 150 to be relatively high, and the clearance 155 is configured to be surrounded by a member made of an insulator or a dielectric, the generation of contamination of metal of the wafer 106 due to the interaction between the conductor ring 132 and the plasma 116 is suppressed.

Still further, a clearance 210 may be arranged between the lower surface of the upper susceptor 151 and the upper surface of the insulator ring 153 with the conductor film arranged therein as illustrated in FIG. 6B in order to raise the controllability of the thickness or distribution of the sheath 160 with respect to the supplied power, or the characteristic of the processing to be obtained. This example includes a configuration in which a side wall surface on an inner peripheral side, a side wall surface on an outer peripheral side and the upper surface of the insulator ring 153 are covered in a state in which the upper susceptor 151 is placed on the lower susceptor 150, and the insulator ring 153 is suppressed form facing the plasma, and it is possible to shield the metal film from the plasma. In this example, the clearance of the space 210 is set by being selected from a range of 0.01 to 1 mm.

Next, a description will be given regarding a mode of control of the power to be supplied to the conductor ring 132 of the plasma processing apparatus according to the present embodiment, and action and an effect thereof with reference to FIGS. 7A to 12. FIGS. 7A to 7C are vertical cross-sectional views schematically illustrating the action exerted in the vicinity of the outer peripheral edge of the wafer including the susceptor according to the modified example illustrated in FIG. 6.

FIG. 7A is a vertical cross-sectional view schematically illustrating a configuration in the vicinity of the outer peripheral edge of the wafer 106 including the susceptor 113 of the conventional technique in which the conductor ring 132 includes the upper susceptor 151 and the lower susceptor 150 which are not arranged in the inner side of the conductor ring 132 in an enlarged manner. As illustrated in FIG. 7A, it is found out that this conventional technique has a configuration in which the sheath 160 of the upper side of the upper surface of the upper susceptor 151 on the outer peripheral portion of the wafer 106 is limited to a perimeter of an outer peripheral edge including the upper surface of the wafer 106, an upper side of an inclined surface forming the part having the ring shape on the inner peripheral side of the upper susceptor 151, and a lower surface of an overhanging portion included in the wafer 106 protruding from the base material 131, and the ions formed in the plasma 116 collide with the wafer 106 along an orbit 161 inclined from the outer peripheral side toward the center side in the outer peripheral edge portion of the wafer 106 and are concentrated on the corresponding portion.

FIG. 7B is a vertical cross-sectional view schematically illustrating a configuration of the sheath 160 generated in the modified example in which the high-frequency power with a predetermined frequency is supplied via the resonant circuit arranged in the load impedance variable box 130 from the second high-frequency bias power source 127 to the conductor film enclosed by the insulator ring 153 illustrated in FIG. 6B. As illustrated in FIG. 6B, an AC voltage subducted to have a negative potential is generated in the upper side of the conductor film on the upper surface of the upper susceptor 151, and the sheath 160 having a thickness equal to or thicker than a predetermined value due to a large potential difference from the plasma with a positive potential is formed in this example. Accordingly, the concentration of the electric field generated in the outer peripheral edge of the wafer 106 in the example of FIG. 7A or the drop of the sheath 160 as being directed in the outer peripheral side of the equipotential surface is mitigated, and the charged particles such as the ions are drawn to the outer peripheral side along the orbit 161 in a direction from the upper side toward the upper surface of the upper susceptor 151 outside the wafer 106 on the upper side of the outer peripheral edge of the wafer 106, and the variation in characteristic of the processing such as the etching rate from the center portion to the outer peripheral edge portion of the wafer 106 is suppressed.

FIG. 7C is a vertical cross-sectional view schematically illustrating a configuration of the sheath 160 to be generated in the susceptor which is grounded via a resonant circuit including a variable coil 200 without including the second high-frequency power source 127 to supply the high-frequency power to the conductor film inside the insulator ring 153 as compared to FIG. 7B. In this configuration, a potential on the upper surface of the upper susceptor 151 is set to a ground potential, and there is a small potential difference from a potential of the plasma 116, and thus, the sheath 160 on the upper surface of the upper susceptor 151 is hardly formed further than in the configuration illustrated in FIG. 7A, and the sheath 160 is limitedly grown in the perimeter of the outer peripheral edge portion including the upper surface of the wafer 106 and the overhanging portion. Thus, the charged particles such as the ions in the plasma 116 are more easily concentrated on the outer peripheral edge portion of the wafer 106 in the configuration of the present example, and thus, the characteristic of the processing of the wafer 106 in the vicinity of the outer peripheral edge portion is more greatly deviated from those in the center portion.

Figure 8A:
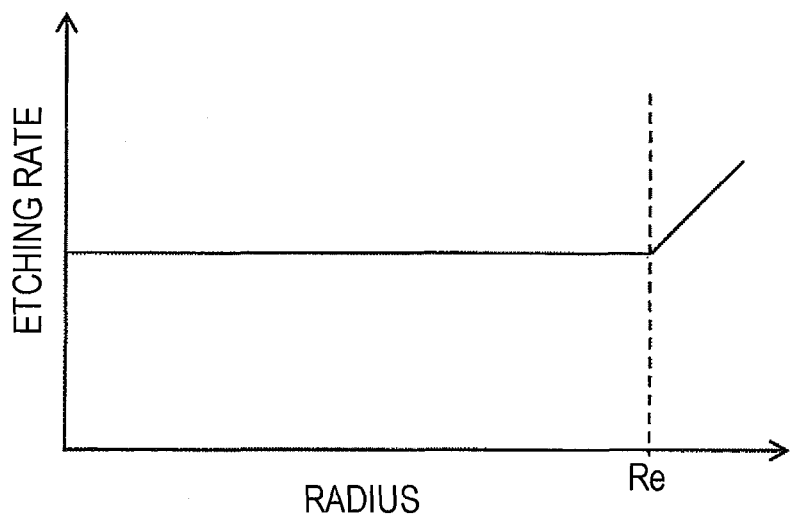
FIGS. 8A and 8B are graphs schematically illustrating distribution examples of an etching rate with respect to a radial direction of an upper surface of a wafer according to the embodiment illustrated in FIG. 5 and the conventional technique.
Figure 8B:
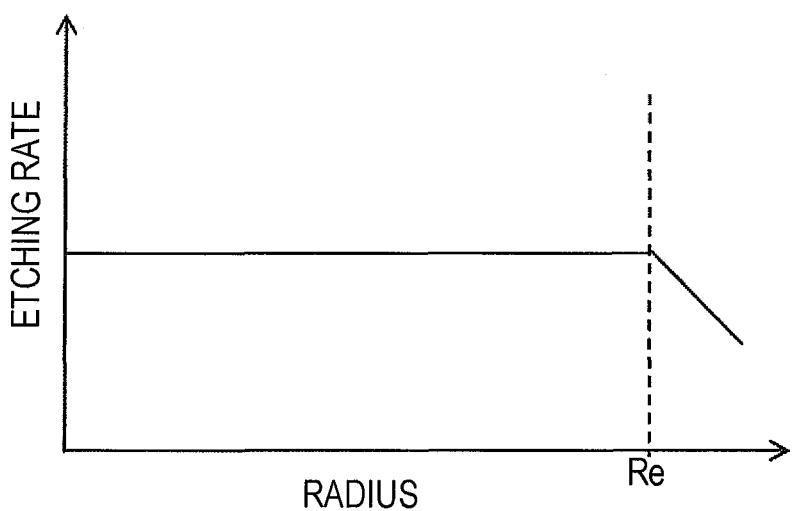

Examples of the above-described characteristic of the processing, particularly the etching rate in the respective configurations illustrated in FIGS. 7A to 7C are illustrated in FIGS. 8A and 8B. FIGS. 8A and 8B are graphs schematically illustrating distribution examples of the etching rate with respect to the radial direction of the upper surface of the wafer 106 according to the embodiment illustrated in FIG. 5 and the conventional technique.

The etching rate in the examples of FIGS. 7A and 7C is substantially constant on the center side but increases in the part on the outer peripheral side as illustrated in FIG. 8A. On the other hand, in the example of FIG. 7B, it is possible to adjust a thickness of the sheath 160 or a height of the equipotential surface to be formed on the upper side of the upper surface of the upper susceptor 151 according to the voltage value VLc of the variable coil 133, and a magnitude or a frequency value of the output from the second high-frequency power source 127. The etching rate in the part on the outer peripheral side of the wafer 106 is formed to be a desired value between the distribution in which the etching rate increases in the region on the outer peripheral side as illustrated in FIG. 8A and the distribution in which the etching rate increases decreases as illustrated in FIG. 8B in the present embodiment in which the above-described adjustment is performed.

Figure 9:
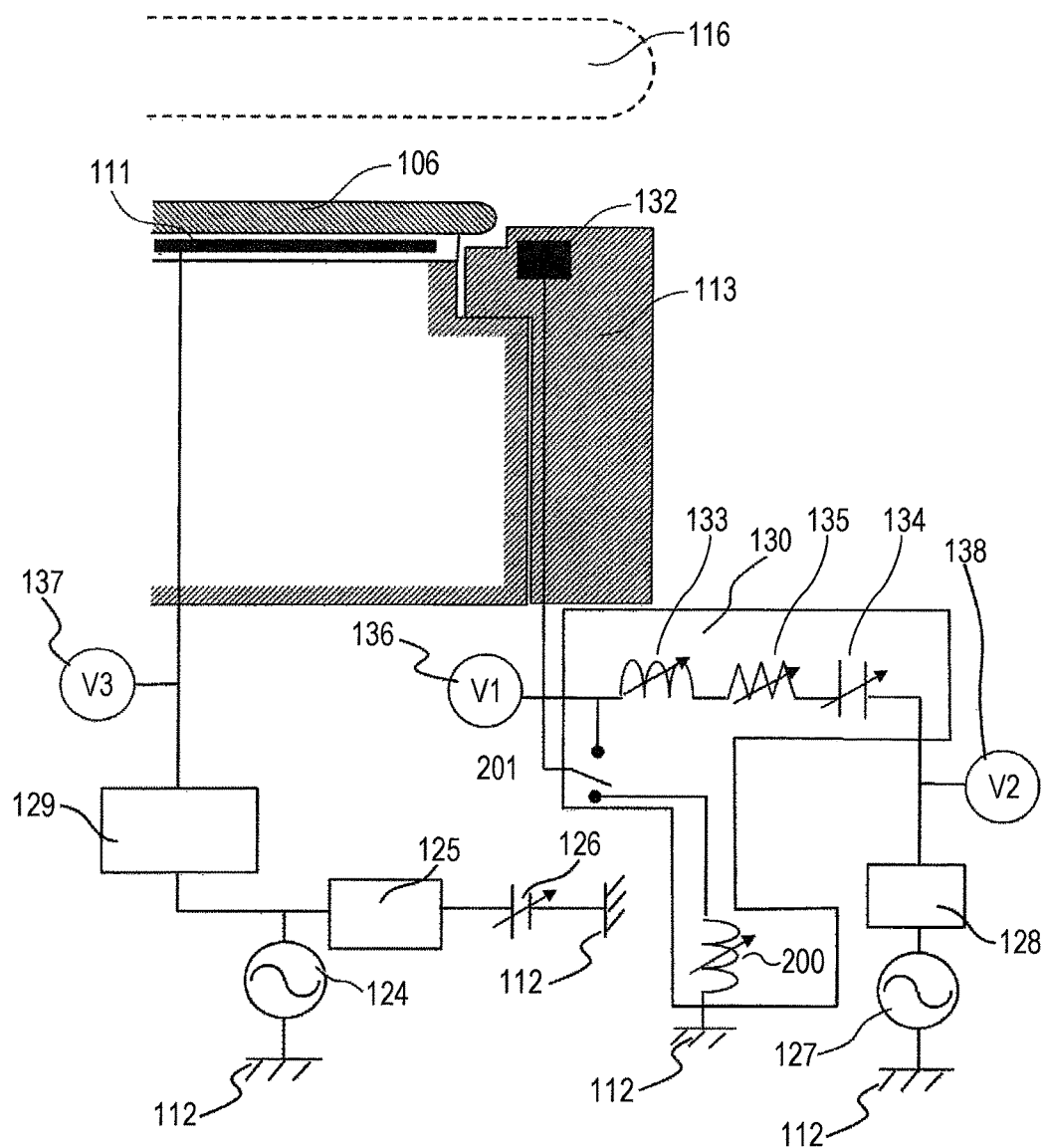
FIG. 9 is a vertical cross-sectional view schematically illustrating a configuration of another modified example of the part on the outer peripheral side of the sample stage according to the embodiment illustrated in FIG. 1 in an enlarged manner.

In addition, the above-described embodiment may be provided with a configuration in which it is possible to perform switch between the power supply path in which the conductor film illustrated in FIG. 7B is connected to the second high-frequency power source 127 via a circuit of a variable RLC including the variable coil 133, and the path in which the conductor film illustrated in FIG. 7C is grounded via the variable coil 200 using a switch 201 arranged inside the load impedance variable box 130 as illustrated in FIG. 9 such that a wafer edge variable release mode and a wafer edge access mode functioning according to the respective path can be switched.

Figure 10A:
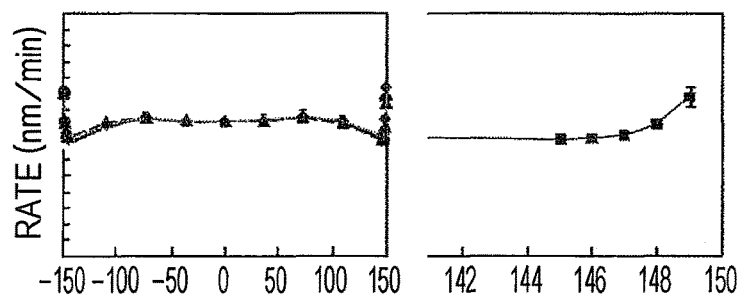
FIGS. 10A to 10O are graphs illustrating detection results of distribution of the etching rate with respect to the radial direction of the wafer processed in the plasma processing apparatus according to the embodiment illustrated in FIG. 5 or FIGS. 6A and 6B.

A description will be given regarding a result of processing the wafer 106 using the embodiment provided with the configuration illustrated in FIG. 5 or FIGS. 6A and 6B with reference to FIGS. 10A to 10O. FIGS. 10A to 10O are graphs illustrating detection results of the distribution of the etching rate with respect to the radial direction of the wafer processed in the plasma processing apparatus according to the embodiment illustrated in FIG. 5 or FIGS. 6A and 6B.

This example illustrates the detection result regarding a plurality of cases having different magnitudes of the high-frequency power for the bias formation with VLc=53 µH. Each left one of the graphs illustrated in FIGS. 10A to 10C is a graph illustrating the distribution of the magnitude of the etching rate from the center of the wafer 106 having a diameter of 300 mm to the outer peripheral edge, and each right graph is a graph illustrating the distribution of the magnitude of the etching rate in the vicinity of the outer peripheral edge in the right end of the drawings.

FIG. 10A illustrates a case in which a high-frequency power of 200 W is supplied from the first high-frequency power source 124 to the conductor film 111 in the dielectric film arranged on the upper surface of the convex portion of the base material 131, and further, a high-frequency power of 0 W is supplied to the conductor ring 132 in the susceptor 113 or the conductor film in the insulator ring 153 arranged on the outer peripheral side of the conductor film 111. FIG. 10B illustrates a result of detecting the characteristic during the processing in a case in which a high-frequency power of 200 W is supplied to the conductor film 111, and a high-frequency power of 20 W is supplied to the conductor ring 132 in the susceptor 113 or the conductor film, and FIG. 10O illustrates a result of detecting the characteristic during the processing in a case in which the each power of 200 W and 50 W is supplied.

Figure 10B:
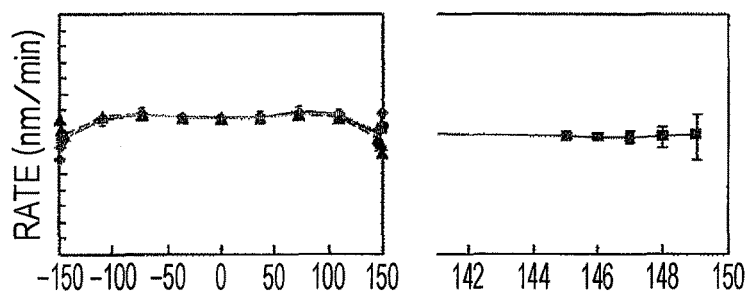
Figure 10C:
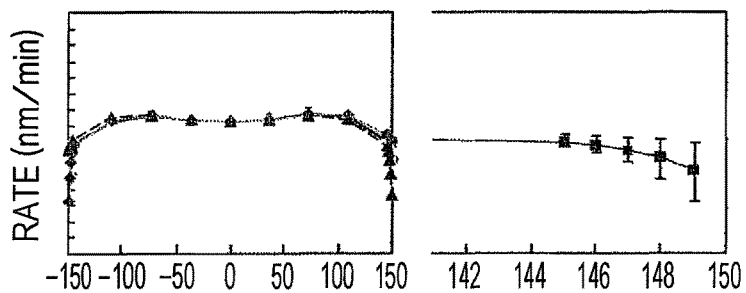

As illustrated in FIGS. 10A to 10C, an etching rate in a region spaced apart from the outer peripheral edge of the wafer 106 by about 10 mm is increased or decreased while being suppressed from affecting on the rate in the center-side part by adjusting the magnitude of the high-frequency power to be supplied to the conductor ring 132 or the conductor film in the insulator ring 153 via the load impedance variable box 130 including the variable coil 133 according to the present embodiment.

In addition, the inventors has detected the distribution of the etching rate regarding a plurality of cases having the different voltage values VLc of the variable coil 133 with a constant magnitude of the high-frequency power for the bias formation. These cases also show that it is possible to adjust the distribution of the etching rate in the part on the outer peripheral side of the wafer 106 independently from that on the center portion side as similarly to the cases illustrated in FIGS. 10A to 10C. In addition, it is found out that is also possible to realize an etching shape, and particularly, an angle in a shape of a processed film structure to be a desired value, other than the etching rate, as the characteristic of the processing, by the adjustment of the high-frequency power or the load impedance according to the above-described embodiment.

Next, a description will be given regarding a configuration in which the high-frequency power source to be supplied from the second high-frequency power source 127 to the susceptor 113 is adjusted with respect to the wear amount of the susceptor 113 along with elapse of time of processing the wafer 106 or an increase of the number of wafers in the above-described embodiment with reference to FIGS. 11A to 12.

The upper surface and a side surface on the outer peripheral side of the upper susceptor 151 face the plasma 116, and are members to be worn by being abraded or altered due to the interaction with the plasma. Thus, the shape of the sheath 160 is changed due to such wear, and accordingly, the distribution of the characteristic of the processing is changed.

For example, when the conductor ring 132 or a part on the upper side of the insulator ring 153 of the upper susceptor 151, which is the dielectric, is worn, and a thickness thereof is reduced, a value Cv of an electrostatic capacitance 170 of the part with respect to the high-frequency power increases, and a potential on the upper surface of the upper susceptor 151 increases. Thus, a problem that the same characteristic of the processing is not realized occurs in a case in which the high-frequency power the same as the previous value is supplied to the conductor ring 132 or the conductor film in the insulator ring 153 in a state in which the wear has occurred.

In order to solve such a problem, the present embodiment is configured to detect information indicating the characteristic of the processing obtained in a predetermined location of the wafer 106, which serves as a reference with respect to a change in the value Cv set in advance before initiating the processing of the wafer 106 as a product to be processed in order to manufacture the semiconductor device, or obtained by being averaged in the in-plane direction, for example, the correlation with the value of the etching rate, and allows the data to be stored in a storage device such as a hard disk, a RAM or a removable disk arranged in a control device (not illustrated) as target data or reference data in a table or a database. FIGS. 11A and 11B are a vertical cross-sectional view schematically illustrating an outline of the configuration of the susceptor of the plasma processing apparatus according to the embodiment illustrated in FIG. 1 and a graph schematically illustrating an example of a data table used by the plasma processing apparatus.

The wafer 106 for obtaining the data serving as the reference is the one having a configuration, approximated to a degree that can be regarded to be the same or equivalent to a wafer as a product, and with the film structure being arranged on the upper surface thereof, and the data is obtained in advance before initiating the processing of the wafer 106 as the product by changing values of the voltage VLc of the variable coil 133 in a plurality of apparatus specifications using the upper susceptors 151 having different thicknesses. The data indicating a correspondence between the electrostatic capacitance Cv of the upper susceptor 151 and the value VLc, with which it is possible to obtain the target value of the characteristic of the processing, the distribution thereof, or the distribution of the processed shape, is extracted as a table from the values of the characteristic of the processing such as the etching rate and the distribution thereof, or a relative relation between the distribution of the processed shape and the value VLc obtained during the processing or after the processing under the respective conditions. A plurality of the wafers 106 serving as the reference to be processed in order to extract such target data may be used.

In the present embodiment, the control device 180 calculates the VLc or a value Pf of the output from the second high-frequency power source based on the information of the data table stored as the database, and transmits a command signal as a value that needs to be set. The control device 180 is connected to the load impedance variable box 130 or the variable coil 133 arranged in the load impedance variable box 130, and an element or a device such as the variable capacitor 134 and the variable resistance 135 in a communicable manner, further connected to the second high-frequency power source 127, the matching device 128, and the voltage monitors 136 and 138 in a communicable manner, and includes an interface of a signal to be communicated, a RAM, the storage device such as the hard disk, a computing unit such as a microprocessor made of a semiconductor, and a communication path which is electrically connected the above-described members and through which the signal is communicated. Incidentally, the storage device is not necessarily stored inside a unit of the control device 180, but may be arranged in a remote location and connected in a communicable manner.

To be specific, the control device 180 detects an initial load in the power supply path to which the high-frequency power for formation of the bias potential is supplied from the second high-frequency power source 127 to the upper surface of the upper susceptor 151 before the initiation of the processing and a impedance value Zs for a predetermined period during which the plasma processing apparatus according to the present embodiment is operated, and causes these values to be stored in the storage device forming the control device 180. Further, a load Zp of the power supply path detected before processing or during processing of an arbitrary ordinal number of the wafer 106 is detected and compared with Zs that has been stored in the storage device Zs, and accordingly, the electrostatic capacitance Cv between the conductor ring 132 or the conductor film on the power supply path and the upper surface of the upper susceptor 151 or the plasma 116 with the interposed upper susceptor 151.

To be specific, the computing unit of the control device detects a reduced amount in thickness as the upper susceptor 151 is worn from Zs-Zp according to an algorithm of software recorded and stored in advance in the storage device, and calculates a current value of Cv using the detected value. The value VLc as the target is calculated using the calculated value Cv and the data table that has been stored in the storage device. Further, a command to set an inductance of VLc to be the calculated target value is transmitted to the variable coil 133 or the element inside the load impedance variable box 130.

Figure 11A:
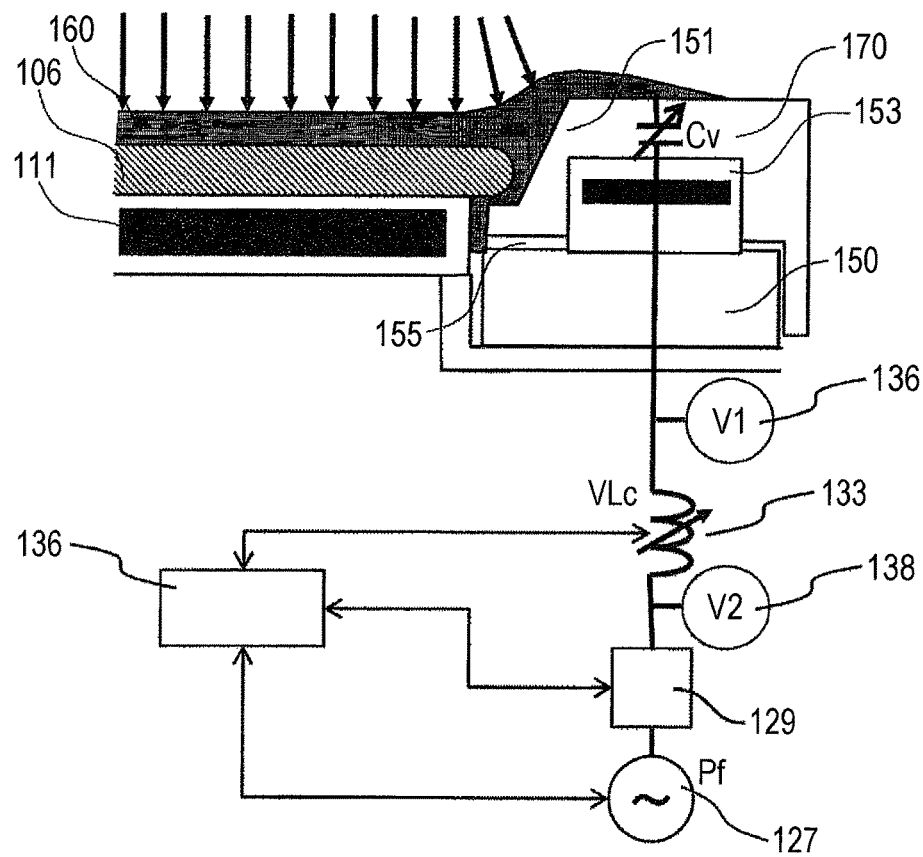
FIGS. 11A and 11B are a vertical cross-sectional view schematically illustrating an outline of a configuration of the susceptor of the plasma processing apparatus according to the embodiment illustrated in FIG. 1 and a graph schematically illustrating an example of a data table used by the plasma processing apparatus, respectively.
Figure 11B:
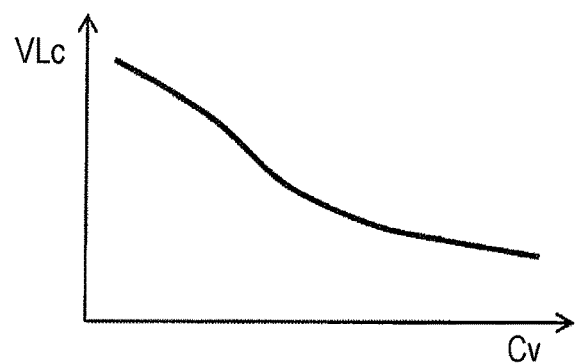
Figure 12:
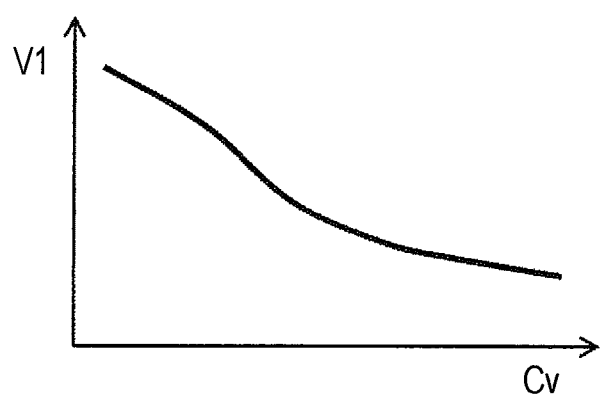
FIG. 12 is a graph schematically illustrating another example of the data table used by the plasma processing apparatus according to the embodiment illustrated in FIG. 1.

Although the data table indicating the corresponding relation between the electrostatic capacitance value Cv on the equivalent circuit on the power supply path with the interposed upper susceptor 151, and the voltage value VLc of the variable coil 133 of the load impedance variable box 130 is used in the examples of FIGS. 11A and 11B, data indicating a relation between an output value V1 from the voltage monitor 136 arranged to be connected to the power supply path between the load impedance variable box 130 and the conductor ring 132 or the conductor film in the insulator ring 153, and the electrostatic capacitance Cv may be used as illustrated in FIG. 12. FIG. 12 is a graph schematically illustrating another example of the data table used by the plasma processing apparatus according to the embodiment illustrated in FIG. 1.

In this example, the voltage value V1, which indirectly affects the characteristic of the processing such as the etching rate is changed when Cv is changed. Thus, similarly to the examples that have been described in FIGS. 11A and 11B, the data indicating the characteristic of the processing obtained in a predetermined location of the wafer 106, which serves as the reference with respect to the change in the value Cv set in advance before initiating the processing of the wafer 106 as the product to be processed in order to manufacture the semiconductor device, or obtained by being averaged in the in-plane direction, for example, the correlation with the value V1 corresponding to the target value of the etching rate is detected, and the data is stored in the storage device such as the hard disk, the RAM or the removable disk arranged in the control device (not illustrated) as the target data or the reference data in the table or the database.

Such detection of the data is implemented in advance before initiating the processing of the wafer 106 as the product in a plurality of apparatus specifications using the upper susceptors 151 having different thicknesses. The data indicating the correspondence between the electrostatic capacitance Cv of the upper susceptor 151 and the value V1, with which it is possible to obtain the target value of the characteristic of the processing, the distribution thereof, or the distribution of the processed shape, is extracted as the table from the values of the characteristic of the processing such as the etching rate and the distribution thereof, or a relative relation between the distribution of the processed shape and the value V1 obtained during the processing or after the processing under the respective conditions, and is stored as the data of the database.

The control device 180 receives the output from the voltage monitor 136, and transmits a command signal to the load impedance variable box 130 so as to change the voltage value VLc of the variable coil 133 in the load impedance variable box 130 to be a predetermined value of V1 with which the intended characteristic of the processing or the intended processed shape can be realized. The control device 180 may adjust the value V1 to be constant in the processing of the wafer 106 as the product, further compare the initial load before or immediately after initiating the processing, that is, the impedance value Zs, and the load Zp of the power supply path detected before processing or during processing of an arbitrary ordinal number of the wafer 106 so as to detect the electrostatic capacitance Cv between the conductor ring 132 or the conductor film on the power supply path and the upper surface of the upper susceptor 151 or the plasma 116 with the interposed upper susceptor 151 from the obtained value of Zs-Zp, calculate the value V1 corresponding to the value Cv using the above-described data table, and implement a feedback control of the load impedance variable box 130 to have the calculated value as similarly to the examples in FIGS. 11A and 11B.

Further, V1 is changed when a value Pf of the magnitude of the high-frequency power from the second high-frequency power source is changed, but it is possible to realize the intended characteristic of the processing or the intended processed shape by adjusting the value VLc such that a ratio V1/V2 between a voltage value V2, which is detected from the output of the voltage monitor 136 arranged to be connected to the power supply path between the load impedance variable box 130 and the matching device 128, and V1 is in a predetermined tolerance range of values, even in a case in which there is an increase or a decrease in V1. In addition, it may be configured such that a value of a ratio V1/V3 between a voltage value V3, which is detected from the output of the voltage monitor 137 arranged to be connected to the power supply path between the conductor film 111 and the first high-frequency power source 124, and V1 is adjusted such that a ratio between the etching rate in the center-side part of the upper surface of the wafer 106 and the etching rate in the part on the outer peripheral side becomes a value in a predetermined tolerance range.

Still further, it is possible to adjust the voltage value VLc of the variable coil 133 of the load impedance variable box 130 by detecting a value A of current of the high-frequency power source flowing the power supply path between the load impedance variable box 130 and the conductor ring 132 or the conductor film in the insulator ring 153, detecting a voltage inside the matching device 129, and setting a product therebetween to be constant, or a value in a predetermined tolerance range. Meanwhile, the output value Pf from the second high-frequency power source 127 is adjusted to a value in the predetermined tolerance range, and the impedance is matched corresponding to the change of the load in the matching device 129 in the present embodiment. It is because there is an influence that greatly affects the characteristic of the processing such as the etching rate, or the processed shape, the influence to be applied locally on the part having the electrostatic capacitance value Cv between the conductor ring 132 or the conductor film and the plasma with the upper susceptor 151 interposed therebetween when the product of the current value A and the voltage value of the matching device 129 is adjusted to be constant.

Further, it is possible to adjust the etching rate of the outer peripheral edge portion of the wafer 106 using the increase or decrease in the thickness of the sheath 160 in the outer peripheral edge portion of the wafer 106 caused by the synergy between V3 and V1. That is, it is found out that a relation between the amount of the etching rate to be corrected (a difference between a detected etching rate at an arbitrary time during the processing and the target etching rate) and the amount of change of the voltage value V1 is as shown in the following formula (1) through the study of the inventors.

$$\Delta ER = K \times (V3 \times \Delta V1) \times Ks + B \quad (1)$$

Here, $\Delta ER$=a difference between a etching rate at an arbitrary time during the processing and the target etching rate, K=a proportionality constant, KS=a proportionality constant indicating a magnitude of the influence of V3 affecting on the thickness of the sheath 160, B=a constant, $\Delta V1$=a control amount for realizing the intended etching rate In general, it is known that a constant multiplier of voltage contributes on the thickness of the sheath 160, and this constant multiplier is indicated by Ks.

According to the inventors, it is found out that the constant multiplier (V3×V1) for the correction of the etching rate in the outer peripheral edge portion of the wafer 106 is proportional to the correction amount of the etching rate as the result of the study. From the result, it is possible to cause the etching rate value and the distribution thereof to approach the target ones, or to reduce the deviation thereof, by obtaining the amount of change of V1 required for the control device 180 using Formula (1) and controlling VLc and Pf of the high-frequency power source 127 that allows realization of the amount of change of V1 in order to obtain a correction amount of a desired etching rate.

Figure 13:
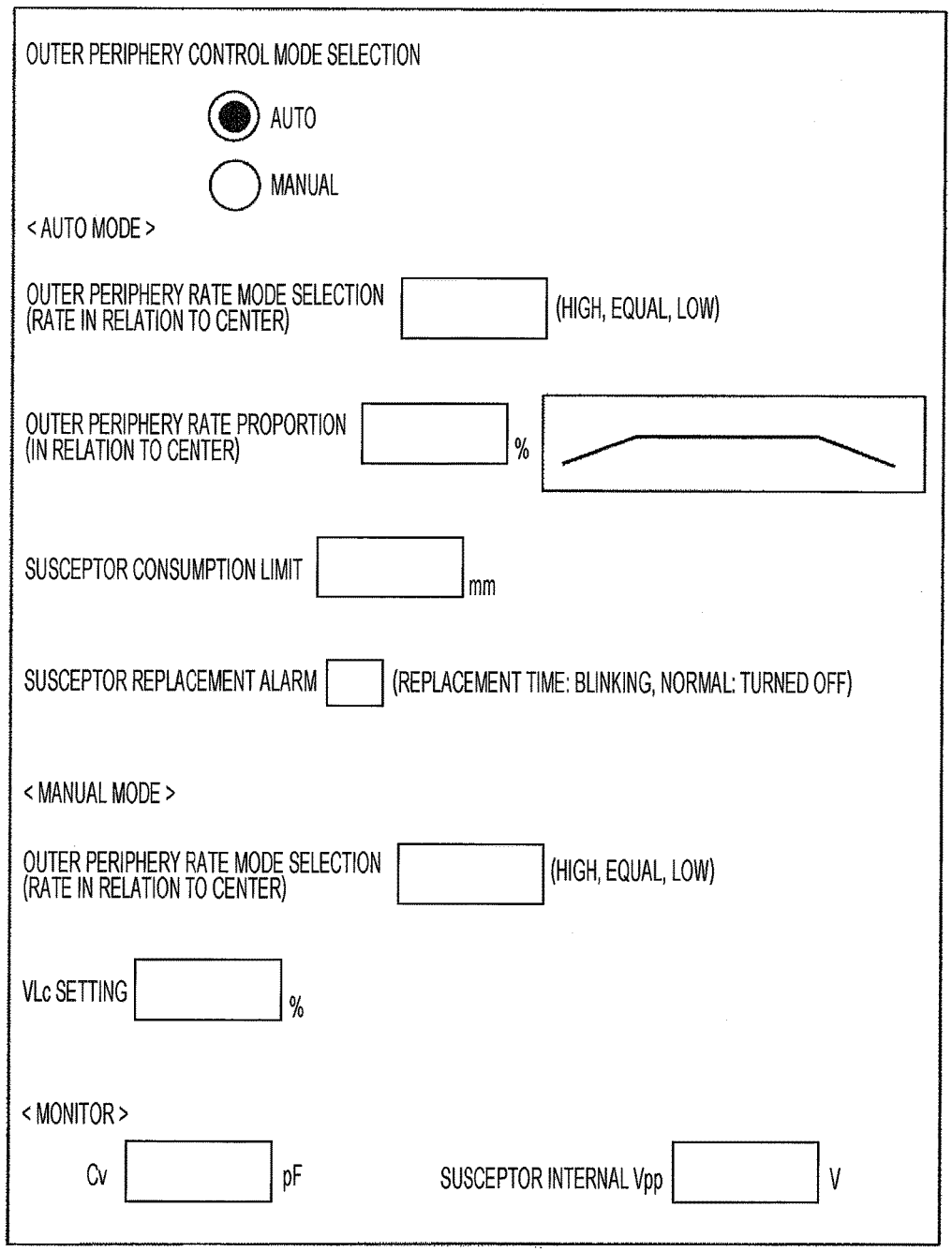
FIG. 13 is a diagram illustrating an example of a screen to be displayed by a display device provided in the plasma processing apparatus according to the embodiment illustrated in FIG. 1.

Next, a description will be given regarding a user interface to be displayed when the user uses the plasma processing apparatus according to the present embodiment with reference to FIG. 13. FIG. 13 is a diagram illustrating an example of a screen to be displayed by a display device provided in the plasma processing apparatus according to the embodiment illustrated in FIG. 1.

The user of the above-described embodiment switches a rate mode of the part on the outer peripheral side between an automatic control and the manual control, and selects whether the rate of the part on the outer peripheral side of the wafer 106 is set to be lower than, higher than, or equal to the rate of the central portion in the auto mode using the user interface as displayed in this manner. In addition, the auto mode is a system in which a susceptor replacement alarm is automatically displayed at the time of reaching a wear limit of the susceptor when a rate proportion thereof is set and the wear limit of the susceptor 113 is set.

In addition, whether the rate in the region on the wafer outer peripheral side is set to be higher than, lower than, or equal to the rate in the region on the center side is selected, and then the inductance value (the voltage value) VLc of the variable coil 133 is directly set to directly adjust VLc to be constant in the manual mode. In addition, it is possible to display the value Cv indicating the wear amount and a potential Vpp of the conductor ring 132 inside the susceptor 113 on the monitor in both the auto mode and the manual mode in the present embodiment.

Figure 14:
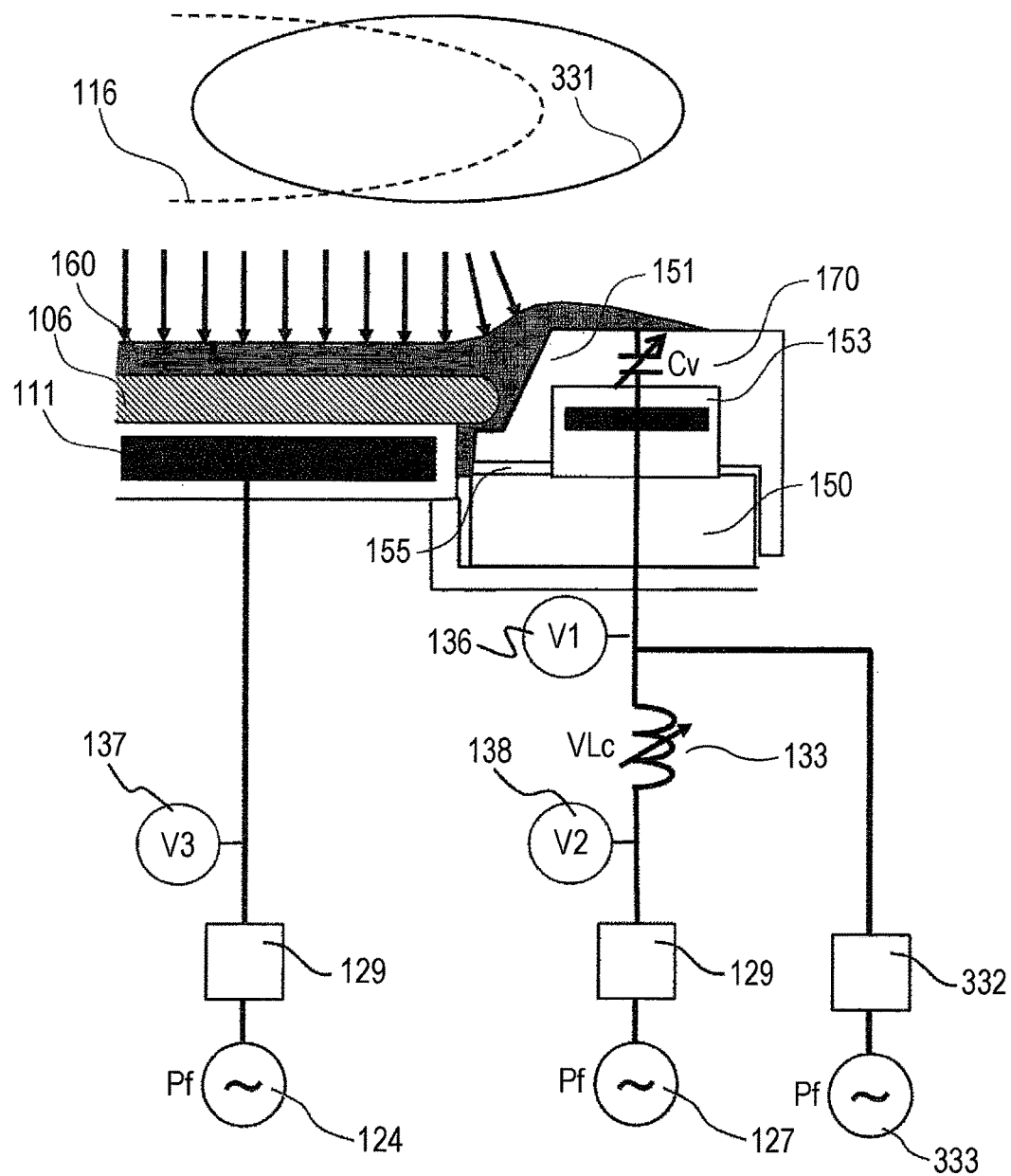
FIG. 14 is a vertical cross-sectional view schematically illustrating an outline of a configuration of another modified example regarding a vicinity of the susceptor of the plasma processing apparatus according to the embodiment illustrated in FIG. 1.

Next, another modified example of the above-described embodiment will be described with reference to FIG. 14. FIG. 14 is a vertical cross-sectional view schematically illustrating an outline of a configuration of another modified example regarding the vicinity of the susceptor of the plasma processing apparatus according to the embodiment illustrated in FIG. 1.

In this example, a portion that is connected to the power supply path to which high-frequency power from a third high-frequency power source 333 is supplied via a matching device 332 is provided in a location between the conductor ring 132 or the conductor film and the load impedance variable box 130 on the power supply path between the second high-frequency power source and the conductor ring 132 or the conductor film in the insulator ring 153. This connection portion is arranged between a location to which the voltage monitor 136 is connected and the load impedance variable box 130.

In the present modified example, the high-frequency power of the third high-frequency power source 333 uses a frequency ten times or higher than the frequency of the first or the second high-frequency power source, and is configured such that the plasma can be generated in the processing chamber 104 using the power. That is, the impedance according to the value Cv of the electrostatic capacitance 170 becomes relatively low, and thus, a second plasma 331 is generated on the part on the outer peripheral side of the wafer 106 and the upper side of the upper susceptor 151 separately from the plasma 116 formed using the electric field or the magnetic field supplied from the upper side of the processing chamber 104 according to such a configuration.

At this time, a voltage value VLc 133 of the variable coil 133 is set to an inductance value that can shut off the high-frequency power that has been supplied from the third high-frequency power source 333 so as not to flow to the matching device 129 and the second high-frequency power source 127.

The second plasma 331 is a plasma to be formed in the processing chamber 104 from the upper side of the wafer 106, that is, the upper side of the center portion to the vicinity of the outer peripheral edge and the upper side of the upper susceptor 151 in the outer peripheral side, and an intensity or a density value and a distribution thereof are adjusted according to a configuration of any one or combination of the configurations of the above-described embodiment. According to such a configuration, the plasma processing apparatus of this example can set the characteristic value of the processing such as the etching rate and the distribution thereof, or the dimension of the processed shape that can be obtained after the processing and the variation thereof to be in an intended range in a wide range from the center portion of the upper surface of the wafer 106 to the part on the outer peripheral side.

In addition, a configuration may be provided in which a conductor film divided into a plurality of regions in the in-plane direction is provided instead of the conductor film 111 to which the power from the first high-frequency power source 124 is supplied in the above-described embodiment, and a power supply path is electrically connected to the conductor film arranged in the region of the center side to supply the high-frequency power from the first high-frequency power source 124 therethrough such that the high-frequency power for formation of the plasma from the third high-frequency power source 333 is supplied to a ring-shaped conductor film on the outer peripheral side arranged inside a ring-shaped region on the outer peripheral side that surrounds the region on the center side on the outer peripheral side through a power supply path electrically connected thereto. The second plasma 331 is formed on the upper side of the part on the outer peripheral side of the upper surface of the wafer 106, the high-frequency power to be supplied to the ring-shaped conductor film is also adjusted according to such a configuration, it is possible to adjust an intensity of the second plasma or a density value and a distribution thereof to intended values, and to enhance the yield of the processing by reducing the variation in the dimension of the processed shape, the characteristic value of the processing or the distribution thereof of the wafer 106.

Although the silicon oxide film is used as the etched material and the tetrafluoromethane gas, the oxygen gas or the trifluoro methane gas is used as the etching gas and the cleaning gas in the present embodiment, the same effect can be obtained using a polysilicon film, a photoresist film, an antireflection organic film, an anti-reflection inorganic film, an organic material, an inorganic material, the silicon oxide film, a silicon nitride oxide film, the silicon nitride film, a Low-k material, a High-k material, an amorphous carbon film, a Si substrate, the metal material, and the like as the etched material other than the silicon oxide film.

Further, examples of the gas used for the etching include a chlorine gas, a hydrogen bromide gas, a tetrafluoromethane gas, a trifluoromethane, a difluoromethane, an argon gas, a helium gas, an oxygen gas, a nitrogen gas, carbon dioxide, carbon monoxide, hydrogen, ammonia, propane octafluoride, nitrogen trifluoride, a sulfur hexafluoride gas, a methane gas, a silicon tetrafluoride gas, a silicon tetrachloride gas, a helium gas, a neon gas, a krypton gas, a xenon gas, a radon gas, and the like.

Although the example of the plasma processing apparatus that performs the etching process using the microwave ECR discharge has been described in the above-described examples, the same action and effect can be exerted by applying the above-described configuration also in a plasma processing apparatus of, for example, the plasma CVD apparatus, an ashing apparatus, a surface modification apparatus, and the like that uses another discharge (a magnetic field UHF discharge, a capacitively coupled discharge, an inductively coupled discharge, a magnetron discharge, a surface wave excitation discharge, or a transfer-coupled discharge).

What is claimed is:

1. A plasma processing apparatus that processes a wafer to be processed, which is placed on a surface of a sample stage arranged in a processing chamber inside a vacuum container, using a plasma formed in the processing chamber, the apparatus comprising:
   a dielectric film which constitutes an upper surface of the sample stage on which the wafer is placed;
   a first electrode which is arranged inside the sample stage below the upper surface of the sample stage and to which a first high-frequency power is supplied during the processing;
   a second electrode having a ring shape, and which is arranged on an upper portion of the sample stage surrounding an upper surface of the sample stage and an outer peripheral side thereof, and to which a second-high frequency power is supplied from a second-high frequency power supply via a matching device and a load impedance variable box, and a series resonant circuit is formed on a power supply path between the second electrode and the second-high frequency power supply, the series resonant circuit being configured to include a coil and a capacitance in series;
   a ring-shaped dielectric cover which is constituted by a dielectric material and arranged surrounding the upper surface of the sample stage and covering the second electrode; and
   a control unit configured to adjust the supply of the first and second high-frequency powers,
   wherein the control device is configured to adjust the supply of the second high-frequency power by adjusting an inductance of the coil using a result of a first voltage detected in a first location between the coil and the second electrode on the power supply path, and
   wherein the coil is part of the load impedance variable box, and the capacitance is between the wafer and the ring-shaped dielectric cover.

2. The plasma processing apparatus according to claim 1, wherein
   the control device adjusts the supply of the second high-frequency power by detecting the first voltage in the first location between the coil and the second electrode on the power supply path and a second voltage in a second location between the coil and the matching device on the power supply path, and adjusting the inductance of the coil such that a ratio between the first and second voltages is set to be a value in a predetermined tolerance range, the matching device being disposed between the second high frequency power supply and the load impedance variable box.

* * * * *